US008020974B2

(12) United States Patent
Hara et al.

(10) Patent No.: US 8,020,974 B2
(45) Date of Patent: Sep. 20, 2011

(54) PIEZOELECTRIC THIN FILM DEVICE AND PIEZOELECTRIC THIN FILM DEVICE MANUFACTURING METHOD, AND INKJET HEAD AND INKJET RECORDING APPARATUS

(75) Inventors: Shintarou Hara, Fukuoka (JP); Osamu Watanabe, Kumamoto (JP); Kazumi Sadamatsu, Kumamoto (JP); Yuuji Toyomura, Fukuoka (JP); Eiji Fujii, Osaka (JP)

(73) Assignee: PANASONIC Corporation, Osaka (JP)

( * ) Notice: Subject to any disclaimer, the term of this patent is extended or adjusted under 35 U.S.C. 154(b) by 712 days.

(21) Appl. No.: 12/022,219

(22) Filed: Jan. 30, 2008

(65) Prior Publication Data
US 2008/0211880 A1 Sep. 4, 2008

(30) Foreign Application Priority Data

Jan. 31, 2007 (JP) ................ P2007-020854
Mar. 2, 2007 (JP) ................ P2007-052483

(51) Int. Cl.
*B41J 2/045* (2006.01)
(52) U.S. Cl. ........................................ 347/70
(58) Field of Classification Search ............ 347/70, 347/68–69, 71–72; 310/363–366; 428/323; 427/100; 204/192.18
See application file for complete search history.

(56) References Cited

U.S. PATENT DOCUMENTS

| 6,013,970 | A | 1/2000 | Nishiwaki et al. |
| 6,051,914 | A | 4/2000 | Nishiwaki |
| 6,097,133 | A | 8/2000 | Shimada et al. |
| 6,103,072 | A | 8/2000 | Nishiwaki et al. |
| 6,194,818 | B1 | 2/2001 | Sumi et al. |
| 6,294,860 | B1 | 9/2001 | Shimada et al. |
| 6,387,225 | B1 | 5/2002 | Shimada et al. |
| 6,511,161 | B2 * | 1/2003 | Sumi et al. ............ 347/68 |
| 6,748,635 | B1 | 6/2004 | Sumi et al. |
| 6,883,901 | B2 | 4/2005 | Murai et al. |
| 6,921,151 | B2 | 7/2005 | Matsuo et al. |

(Continued)

FOREIGN PATENT DOCUMENTS

JP  9-298324  11/1997

(Continued)

OTHER PUBLICATIONS

Joo et al., "Fabrication of the Single Grained PZT Thin Film Device," Ferroelectrics, 1997, vol. 196, pp. 1-4.

*Primary Examiner* — Kristal Feggins
(74) *Attorney, Agent, or Firm* — Greenblum & Bernstein, P.L.C.

(57) ABSTRACT

One objective of the invention is to provide a highly-efficient and reliable piezoelectric thin film device by improving the piezoelectric function of a piezoelectric thin film and obtaining a crystal structure wherein the dependency of a piezoelectric constant, relative to a voltage, is superior, and to also provide a method for manufacturing this piezoelectric thin film device. Another objective of the invention is to provide an inkjet head that satisfactorily exhibits the piezoelectric performance of the piezoelectric thin film device and that has a superior withstand voltage function and driving reliability, and to provide a high quality inkjet recording apparatus on which this inkjet head can be mounted. A piezoelectric thin film device includes: crystal grains that form piezoelectric thin film and grain boundaries that encircle the crystal grains, wherein the same crystal orientation is established for the grain boundaries and the crystal grains.

13 Claims, 17 Drawing Sheets

11: SUBSTRATE
12: ADHESIVE LAYER
13: FIRST ELECTRODE LAYER
14: PIEZOELECTRIC THIN FILM LAYER
15: PIEZOELECTRIC THIN FILM DEVICE
16: SECOND ELECTRODE LAYER

U.S. PATENT DOCUMENTS

| | | |
|---|---|---|
| 6,986,564 B2 | 1/2006 | Matsuo et al. |
| 7,240,409 B2 | 7/2007 | Sumi et al. |
| 2008/0055370 A1* | 3/2008 | Sakamoto et al. .............. 347/70 |

FOREIGN PATENT DOCUMENTS

| | | |
|---|---|---|
| JP | 10-081016 | 3/1998 |
| JP | 10-217458 | 8/1998 |
| JP | 11-214763 | 8/1999 |
| JP | 11-238920 | 8/1999 |
| JP | 11-307834 | 11/1999 |
| JP | 2000-252544 | 9/2000 |
| JP | 2000-307163 | 11/2000 |
| JP | 2001-237468 | 8/2001 |
| JP | 2001-332041 | 11/2001 |
| JP | 2002-225285 | 8/2002 |
| JP | 2006-217188 | 8/2006 |
| JP | 2006-324681 | 11/2006 |

* cited by examiner

11: SUBSTRATE
12: ADHESIVE LAYER
13: FIRST ELECTRODE LAYER
14: PIEZOELECTRIC THIN FILM LAYER
15: PIEZOELECTRIC THIN FILM DEVICE
16: SECOND ELECTRODE LAYER

50: CRYSTAL GRAIN
51: GRAIN BOUNDARY

50: CRYSTAL GRAIN
51: GRAIN BOUNDARY

519

PIEZOELECTRIC THIN FILM DEVICE AND PIEZOELECTRIC THIN FILM DEVICE MANUFACTURING METHOD, AND INKJET HEAD AND INKJET RECORDING APPARATUS

BACKGROUND

1. Field of the Invention

The present invention relates to a piezoelectric thin film device having an electromechanical conversion function and a manufacturing method for this piezoelectric thin film device, and an inkjet head and an inkjet recording apparatus.

2. Description of the Related Art

A common piezoelectric thin film device includes a lamination member provided by sandwiching a piezoelectric member, in the direction of its thickness, between two electrodes.

A polycrystal is usually employed as the piezoelectric thin film of such a device, and the crystal structure includes a plurality of crystal grains, which constitute the piezoelectric thin film, and grain boundaries, extant among the crystal grains. Various methods have been proposed to improve the structure to increase the piezoelectric characteristics. The affect produced by a defect in crystal grains, such as a lack of oxygen and the affect produced by the sizes of the crystal grains or the state of the grain boundaries, are especially regarded as factors for determining the superiority or inferiority of the withstand voltage characteristic of the piezoelectric thin film, and several views and improved proposals are disclosed, for example, in JP-A-2000-307163, JP-A-2001-237468 and JP-A-10-217458.

Also as described in JP-A-11-214763, in a case wherein very little or almost no foreign substance is present at grain boundaries, there is very little domain migration in the piezoelectric thin film, and the occurrence of gaps along the grain boundaries due to domain migration can be suppressed. However, orientation at the grain boundaries is discontinued with crystal grains, and further, according to the result obtained by the XRD analysis, a peak that it is not intended to be obtained, such as (110), is also observed. Furthermore, according to this description, precipitation of a compound, such as a PbO, that does not have a piezoelectric characteristic occurs at the grain boundaries.

One problem is that when a polycrystal is employed as a piezoelectric thin film, the voltage-strain characteristic (the displacement characteristic) of the piezoelectric thin film is such that linearity is inferior relative to the voltage application hysteresis. Another problem encountered when a polycrystal is used to form a piezoelectric thin film is that in a low field intensity area the displacement, relative to an applied voltage, is small, while in a high field intensity area the displacement is comparatively increased. And since a piezoelectric constant d31 is proportional to the displacement, a further problem is that the piezoelectric constant will not be steady relative to an applied voltage.

SUMMARY

While taking these problems into account, one objective of the present invention is to provide a highly efficient and reliable piezoelectric thin film device, by improving the piezoelectric function of a piezoelectric thin film formed of a polycrystal, and obtaining a crystal structure for which the dependency of a piezoelectric constant, relative to a voltage, is superior, and to provide a method for manufacturing the piezoelectric thin film device.

The present invention provides a piezoelectric thin film device obtained by sandwiching a piezoelectric thin film between electrodes, wherein the piezoelectric thin film includes crystal grains and grain boundaries that are formed among the crystal grains, and wherein the same orientation is established for the grain boundaries and the crystal grains.

According to this arrangement of the present invention, a piezoelectric thin film device that includes an improved piezoelectric function, low dependency of a piezoelectric constant relative to a voltage and a superior withstand voltage function can be provided.

DETAILED DESCRIPTION

Figure 1:
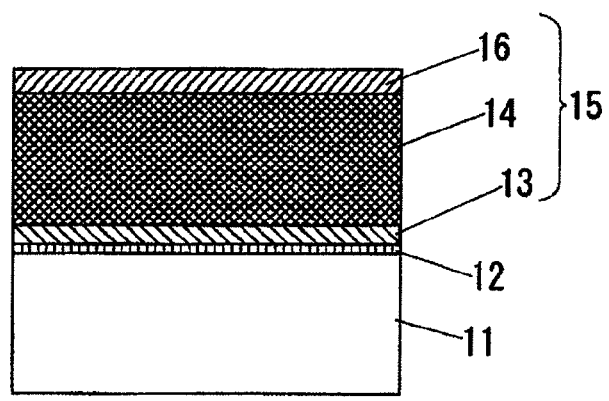
FIG. 1 is a schematic cross sectional view of a piezoelectric thin film device according to a first embodiment of the present invention.

Generally, a piezoelectric thin film device provides a lamination member that is formed by sandwiching a piezoelectric thin film, in the direction of its thickness, between two electrodes.

The piezoelectric thin film is composed of a material for either converting mechanical energy into electrical energy or for converting electrical energy into mechanical energy. A material such as lead zirconate titanate (Pb(Zr, Ti)O$_3$) (hereinafter referred to as PZT), which is an oxide having a perovskite crystal structure, or a material obtained by doping, to PZT, magnesium, manganese, nickel or niobium is well known as a typical piezoelectric material used for forming a piezoelectric thin film.

For a case involving the use of tetragonal system PZT, which has a perovskite crystal structure, an especially great piezoelectric displacement is obtained in the <001> direction of the axis (the C axial direction), and for a case involving the use of hexagonal system PZT, such a displacement is obtained in the <111> direction.

Various methods have been devised to improve the piezoelectric function of a piezoelectric thin film device, and one of them is proposed, for example, in "JAE-HYUN JOO, YOU-JIN LEE, SEUNG-KI JOO, Ferroelectrics, 1997, vol. 196, pp. 1-4". According to this method, on a single crystal substrate made, for example, of MgO, a Pt electrode and a PZT thin film are epitaxially grown, forming a single crystal PZT thin film.

A PZT thin film formed through epitaxial growth is a single crystal thin film, for which a grain boundary does not exist. Therefore, when the piezoelectric thin film is polarized by applying an electric field, a very satisfactory polarization hysteresis is obtained because the direction of the polarization axis is aligned from the beginning. Further, in addition to the superior piezoelectric characteristic, superior tracking and reproduction characteristics are obtained relative to the hysteresis of voltages applied to the piezoelectric thin film. That is, for the single crystal thin film, an almost linear correlation is obtained between displacement and voltage, and relative to the voltage applied, a steady piezoelectric constant is provided.

However, many piezoelectric materials are polycrystal and consist of a set of crystal grains, and the individual crystal axes face in all directions. Therefore, spontaneous polarized Ps are arranged in all directions, and a piezoelectric thin film device employing a piezoelectric characteristic is so provided that the sum of these vectors should be directed parallel to the electric field. Further, in the case of a piezoelectric actuator (for which a vibration plate is mounted on the lamination member), which is one mode of the piezoelectric thin film, when a voltage is applied between the two electrodes, a mechanical displacement proportional to the magnitude of the voltage can effectively be obtained.

In addition, when the piezoelectric material is polycrystal, the growth of crystal grains and the configuration of the grain boundaries are changed in accordance with the composition of the piezoelectric thin film and the manufacturing conditions, and various pattern types are obtained as dependencies of the piezoelectric characteristic relative to a voltage. When the dependency of a piezoelectric constant d31 relative to a voltage is high, and when, as an example, a piezoelectric thin film device is employed as the actuator of an inkjet head, a problem has arisen in that an accurate volume of ink droplets to be ejected can not be controlled in consonance with displacement.

Moreover, for a piezoelectric thin film formed of polycrystal, the domain (the crystal grains) of the piezoelectric member is migrated so as to align the polarization direction with the field direction when a voltage is applied. For example, in JP-A-11-214763, which is described above, it is disclosed that the grain boundaries that are defined between the crystal grains during migration greatly affects the residual strain of the piezoelectric thin film, the strain characteristic (the displacement characteristic) and the withstand voltage characteristic.

Further, another polycrystal problem is reliability. Domain migration that occurs due to the application of a voltage causes cracks in the crystal grains, or the precipitation of an excessive amount of Pb in the grain boundaries becomes a path for current leakage.

In order to resolve these problems, as described above, there is one idea that a piezoelectric thin film is to be formed of a single crystal. However, managing an increase in the size of an MgO substrate comprising a single crystal is difficult, and this is a problem that will adversely affect mass production. Thus, adoption of this method is actually difficult.

First Embodiment

A first embodiment of the present invention will now be described in detail while referring to the accompanying drawings.

FIG. 1 is a schematic cross sectional view of a piezoelectric thin film device according to the first embodiment of the invention.

In FIG. 1, a substrate 11 is formed of a φ4 inch silicon (Si) wafer, having a thickness of 0.3 mm, and an adhesive layer 12, having a thickness of 0.02 μm, for example, is made of titanium (Ti) and formed on the substrate 11. The substrate 11 is not limited to an Si substrate, and may instead be a glass substrate, a metal substrate or a ceramics substrate.

A first electrode layer 13, made of platinum (Pt) and having a thickness of 0.22 μm, for example, is formed on the adhesive layer 12.

A piezoelectric thin film layer 14, composed of PZT, that has a rhombohedral or tetragonal system perovskite crystal structure having a thickness of 3.5 μm, for example, is formed on the first electrode layer 13. The piezoelectric thin film layer 14 is preferentially oriented with the (001) plane. The composition of the piezoelectric thin film layer 14 is a composition (Zr/Ti=53/47) near the boundary (morphotropic phase boundary) between the tetragonal system and the rhombohedral system. However, the Zr/Ti composition used for the piezoelectric thin film layer 14 is not limited to Zr/Ti=53/47, and Zr/Ti=from 30/70 to 70/30 is simply required. Further, an arbitrary piezoelectric material that contains PZT as its primary element, e.g., a material obtained by adding, a dopant, such as La, Sr, Nb or Al, to PZT, can be employed to form the piezoelectric thin film layer 14, and PMN or PZN may also be employed.

Furthermore, so long as single orientation is obtained, a preferential orientation with the (111) plane may be employed. The same effects can also be provided through another orientation, just so long as the piezoelectric characteristic is obtained and a single orientation is performed. Further, in the first embodiment, as for the piezoelectric thin film layer 14, there are no peaks for a Pb compound, such as PbO, that does not demonstrate the piezoelectric characteristic and another compound that contains composite elements such as TiO or $ZrO_2$.

The thickness of the piezoelectric thin film layer 14 need only fall within a range of 0.5 to 10.0 μm. Preferably, the thickness is 1.0 to 5.0 μm, and when the thickness falls within this range, a displacement appropriate for a piezoelectric actuator can be obtained.

Well known methods for forming a piezoelectric thin film are a physical vapor deposition method (PVD) such as sputtering, a method, such as laser ablation or chemical vapor deposition (CVD), for forming film in a vacuum and a method, such as the sol-gel process, hydrothermal crystal growth (a technique for growing seed crystal in heated alkaline water) or aerosol deposition, that does not employ vacuum. An arbitrary method can be employed so long as the following film formation conditions and film formation environment can be provided: entering of external foreign substances, such as compounds that do not demonstrate a piezoelectric characteristic, is prevented, crystal grains 50 (see FIG. 4) used to form the piezoelectric thin film layer 14 composed of PZT film are uniformly and closely arranged, and a single orientation is provided such that the same crystal orientation is established for the crystal grains 50 and for the grain boundaries 51 (see FIG. 4).

In the first embodiment, the sputtering method is employed for film formation, and by using sputtering, "eliminating the generation of a compound, for example, that does not demonstrate the piezoelectric characteristic" described above is more appropriately enabled. For film formation at this time, it is especially effective to employ a PZT composition target that has the same composition, or the same ratio of Zr or Ti, as a piezoelectric thin film to be formed, and that contains an excessive amount of Pb, of from 0 to 0.4 mol.

This is because during a film formation process using sputtering, since the temperature of the substrate 11 will be high and the vapor pressure of Pb will be low, the Pb will again be evaporated and will easily be removed from the film. The amount of Pb that is re-evaporated also will change in accordance with a difference in the film formation conditions, such as the sputtering pressure and the temperature of the substrate 11, and when the amount of Pb contained in the PZT film to be prepared is lower than the theoretical value, the degrading of the orientation or the deterioration of the piezoelectric characteristic may occur. Therefore, an excessive amount of Pb should be doped to the target in advance.

Further, according to the method of the first embodiment, when film formation is performed using sputtering, the substrate 11 is heated to a specific temperature to establish a predetermined crystal orientation (e.g., (001) orientation), and thus, the predetermined crystal orientation is established at the same time as the film is formed.

That is, according to the sputtering method of the first embodiment, ions in plasma strike a sintered target (a PZT target) that is employed and that has the above described composition, and PZT particles (Pb, Ti, Zr and O ions or atoms) separating from the target are forced out and react with the substrate 11, which is heated to a specific, predetermined temperature. As a result, growth of the crystal PZT film is induced.

This process differs from a process, which is generally performed using the hydrothermal crystal growth method or the sol-gel method, in which a film, such as a precursor, having a different crystallinity is formed first, and then pre-sintering and post-sintering are repeated. Further, the above described method is not one according to which a core is formed by using previously provided seed crystals. According to the first embodiment, sputtered particles land on the heated substrate 11 and are aggregated on the surface thereof and turned into cores, which then grow into crystal grains. Furthermore, the crystal grains themselves then grow and provide an oriented film. Since flying particles strike the atoms or ions that constitute PZT, all of the particles react, becoming PZT crystal, and are fetched into the crystal grains 50. Therefore, foreign substances or crystals having orientations that differ from that of the crystal grains 50 are not present in the grain boundaries 51. Thus, as a result of this process, the crystal orientation of the grain boundaries 51 matches that of the crystal grains 50.

Generally, the mechanisms of the vapor phase growth methods, such as the PVD or the CVD, are all very similar, and when a film formation condition is property set, these method are appropriate for the forming of films having the same characteristic. On the other hand, when a film formation method such as the sol-gel method or the hydrothermal crystal growth method is employed, unlike during the process for forming a film in a vacuum, the entrance of a foreign substance during the process is required, and the management of the purity of a start material is also a problem. Further, since crystallization is performed step by step, part of the material may not be completely crystallized, or a composition, such as PbO, that interferes with the piezoelectric characteristic, may be precipitated in the grain boundaries 51. Since it is difficult for these problems to be controlled by managing the film formation environment or the film formation conditions, and while taking into account the reproducibility of the film formation, the vapor phase growth method is more appropriate.

A second electrode layer 16, which has a thickness of 0.2 μm, for example, and is made of Pt, is formed on the piezoelectric thin film layer 14. The material for the second electrode layer 16, however, is not limited to Pt; any other conductive material can be employed, and the film can range in thickness from 0.1 to 0.5 μm.

A piezoelectric thin film device 15 includes the piezoelectric thin film layer 14 sandwiched between the first electrode layer 13 and the second electrode layer 16, so that by applying a voltage to the two electrodes, a displacement characteristic, actually a piezoelectric strain characteristic, can be obtained.

For film formation of the piezoelectric thin film device 15, a vapor phase growth method, such as sputtering, vacuum evaporation, laser ablation, ion plating, MBE, MOCVD, or plasma CVD is preferable, but the sol-gel method or the hydrothermal crystal growth method, which has recently drawn attention, may also be employed.

The adhesive layer 12 is formed to increase the contact between the substrate 11 and the first electrode layer 13, and the material used can not only be Ti, but also tantalum, iron, cobalt, nickel, chromium, or a compound of them, and the thickness of the adhesive layer 12 may range from 0.005 to 1.0 μm. This adhesive layer 12, however, is not always necessary, so long as a close contact is obtained between the substrate 11 and the first electrode layer 13.

(Sample 1)

Sample 1 of this invention will now be described in more detail while referring to FIG. 1.

In sample 1, a detailed explanation will be given for an example wherein, using sputtering, the adhesive layer 12, the first electrode layer 13, the piezoelectric thin film layer 14 and the second electrode layer 16 are sequentially formed on an Si substrate 11.

The substrate 11 was heated to 400° C., and using a Ti target, a 100 W high-frequency AC power was applied in argon gas at 1 Pa for one minute. Thus, the adhesive layer 12 was obtained.

For forming the first electrode layer 13, the substrate 11 was heated to 600° C., and using a Pt target, 200 W high-frequency AC power was applied in argon gas at 1 Pa for seven minutes. Pursuant to these conditions, the thickness of the first electrode layer 13 was 0.1 μm, and the Pt material of the first electrode layer 13 was oriented on (111) plane. The material for the first electrode layer 13 may be, at the least, a precious metal selected from among Pt, iridium, palladium and ruthenium, or one of their compounds, and the film thickness may range from 0.05 to 2.0 μm.

The piezoelectric thin film layer 14 was then formed by a multi-target sputtering apparatus.

A PZT sintered target (Zr/Ti=53/47, and Pb, in an amount augmented by a 20 mol % excess) was employed that contains more Pb than a stoichiometric composition. First, the substrate 11 was heated to a substrate temperature of 600° C., and then, in a mixed atmosphere of argon and oxygen (gas volume ratio of Ar:$O_2$=19.5:0.5), a film was deposited over a period of 170 minutes, during which the film formation conditions were such that the degree of vacuum is 0.3 Pa and 250 W high-frequency AC power was applied.

Further, at room temperature, 200 W high-frequency AC power was applied, using a Pt target, in argon gas at 1 Pa over a period of 14 minutes. Thus, the second electrode layer 16 was obtained.

Figure 2:
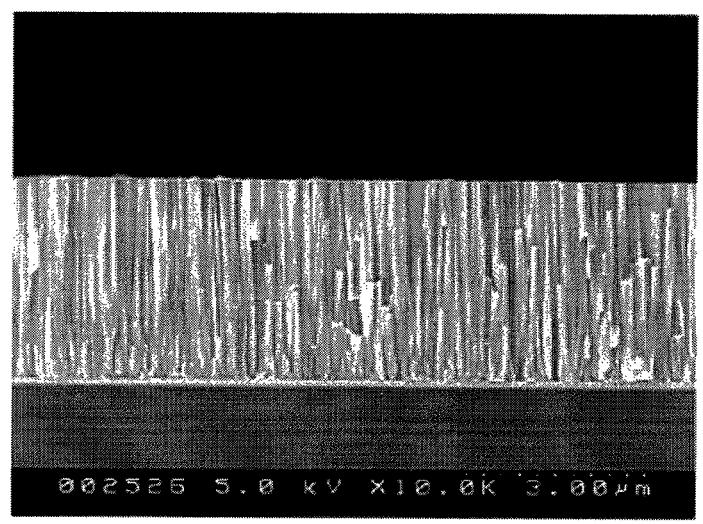
FIG. 2 is a diagram showing an SEM cross sectional photograph of a piezoelectric thin film according to the first embodiment of the present invention.

FIG. 2 is a diagram showing an SEM cross sectional photograph of the piezoelectric thin film for sample 1 of the invention.

The photograph in FIG. 2 is obtained by observing particulars of the SEM cross section of the piezoelectric thin film that was provided in the first embodiment, i.e., which was formed on the Pt material that serves as the first electrode layer 13 on which the second electrode layer 16 was not yet deposited.

Figure 3:
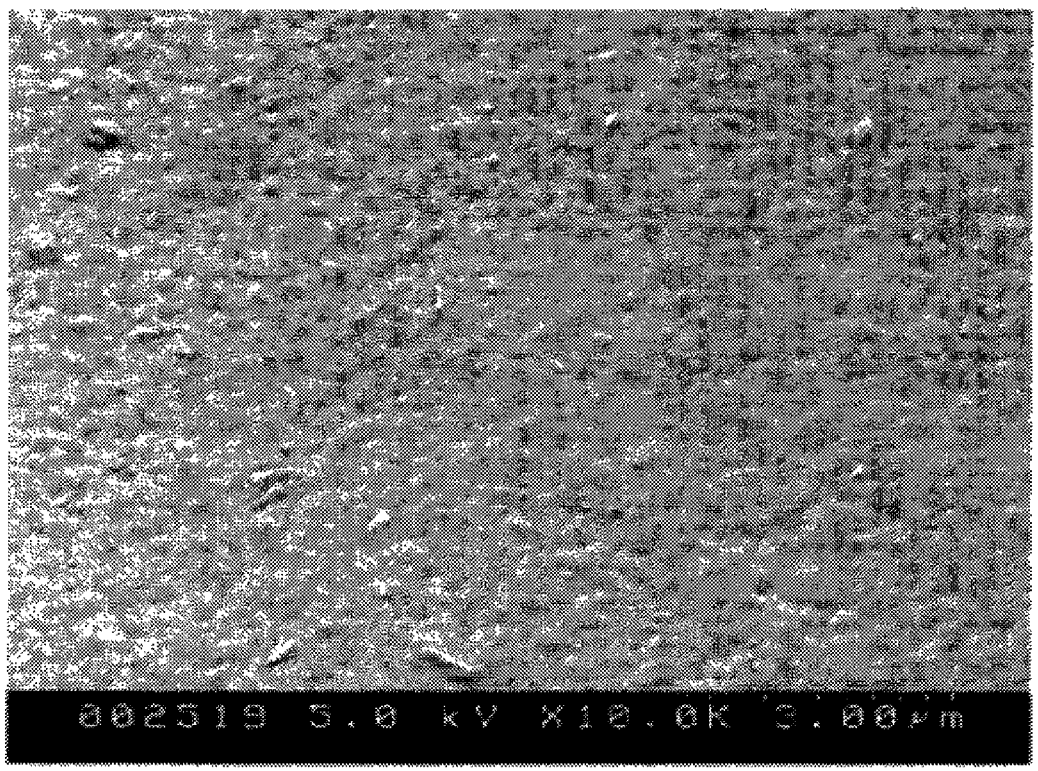
FIG. 3 is a diagram showing an SEM surface photograph of the piezoelectric thin film according to the first embodiment of the present invention.

FIG. 3 is a diagram showing a SEM surface photograph of the piezoelectric thin film of sample 1 of the invention.

While referring to FIGS. 2 and 3, it is found that PZT, of which the piezoelectric thin film layer 14 is composed, is formed of polygonal and columnar crystals that have grown, like columns, outward from the first electrode layer 13, in the direction of its thickness, and are sequentially arranged substantially in the perpendicular direction.

Following this, the piezoelectric thin film layer 14 in sample 1 was observed in detail using a transmission electron microscope (a TEM).

Figure 4:
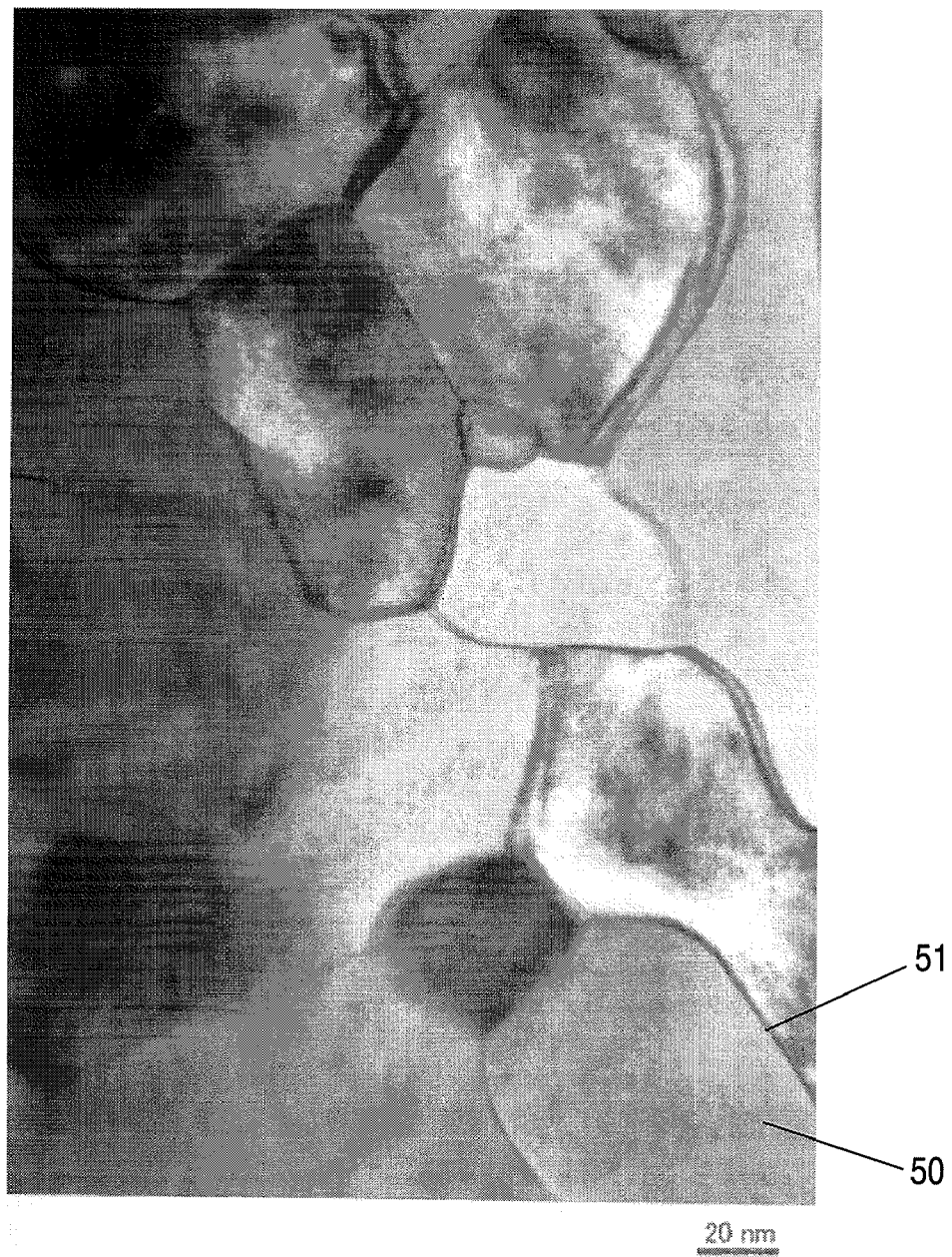
FIG. 4 is a diagram showing a TEM observed image obtained by observing the piezoelectric thin film of the first embodiment using a transmission electron microscope (TEM).

FIG. 4 is a diagram showing the TEM observed image, obtained by the transmission electron microscope (the TEM), of the piezoelectric thin film in sample 1 of the invention.

While referring to FIG. 4, the crystal grains 50 of sizes of from 0.02 μm to 0.5 μm are formed adjacent to each other, and the grain boundaries 51 are formed among the crystal grains 50. The crystal grains 50 are closely arranged, and the widths of the grain boundaries 51 between the crystal grains 50 are substantially equal. The widths of the grain boundaries 51 range from 1 nm to 5 nm, and no empty spaces, for example, are observed.

Figure 5:
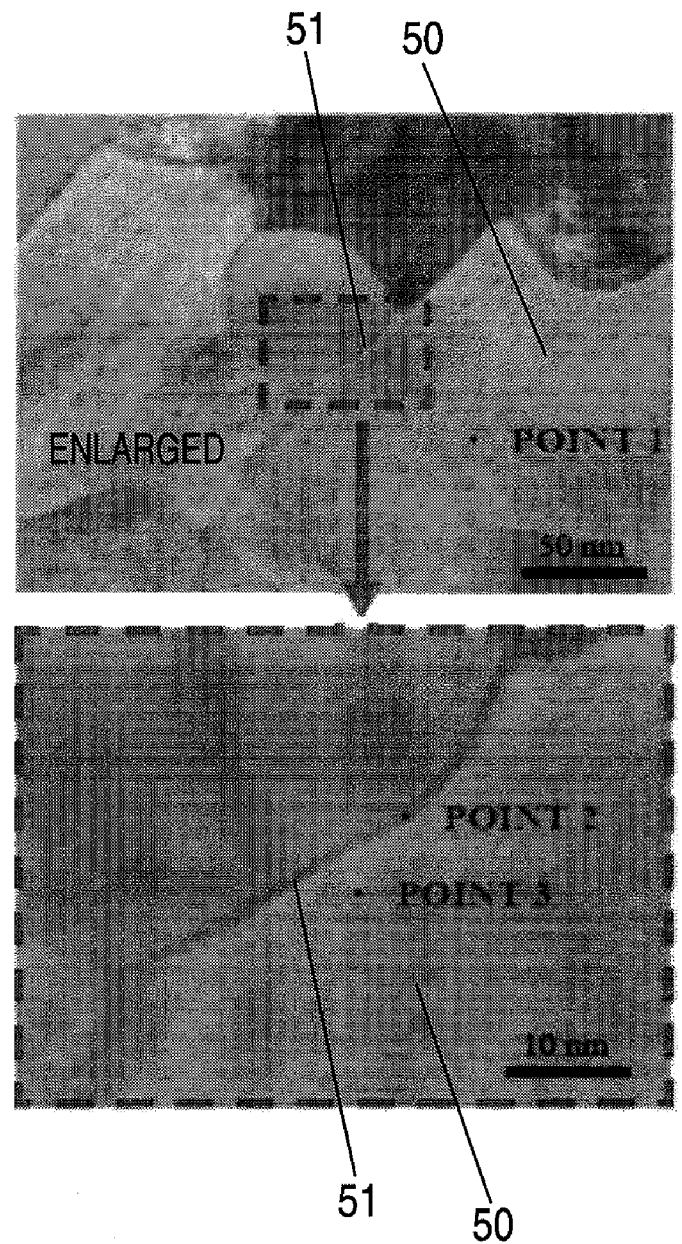
FIG. 5 is a diagram showing a TEM observed image indicating measurement points at which composition analyses were performed for the crystal grains and the grain boundaries of the piezoelectric thin film of the first embodiment.
Figure 6:
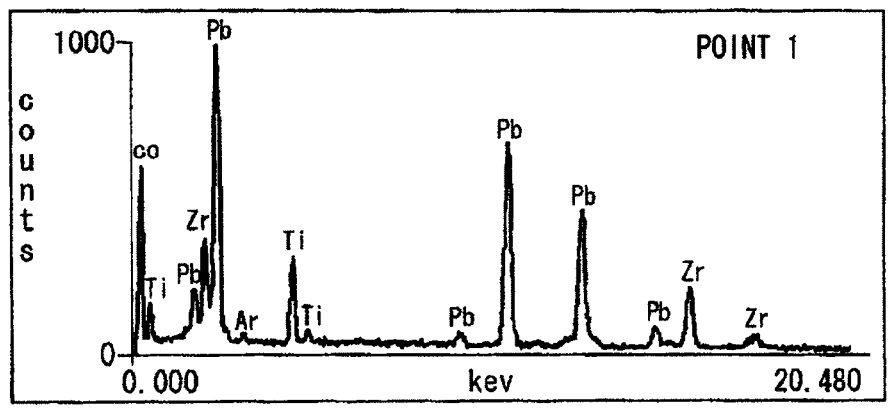
FIG. 6 is a graph showing the results of the ultimate analysis of the piezoelectric thin film of the first embodiment of the invention.
Figure 6:
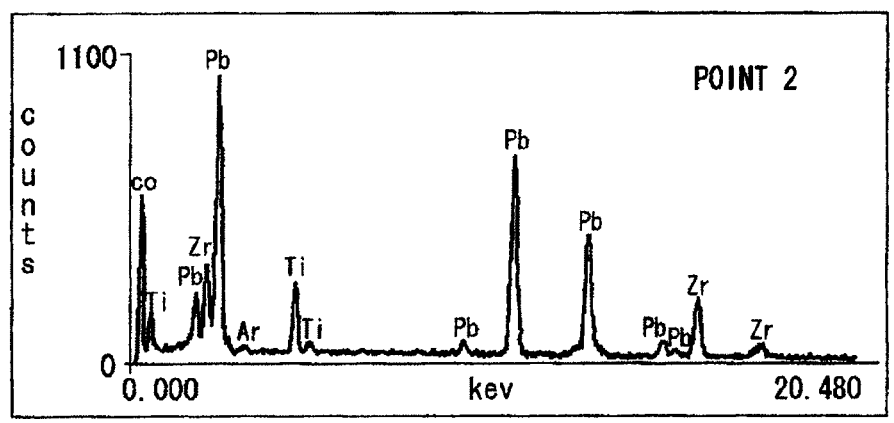
Figure 6:
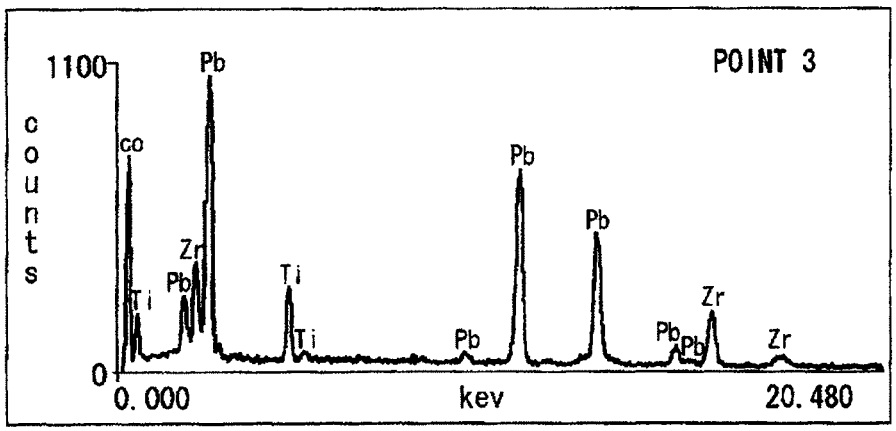
Figure 7:
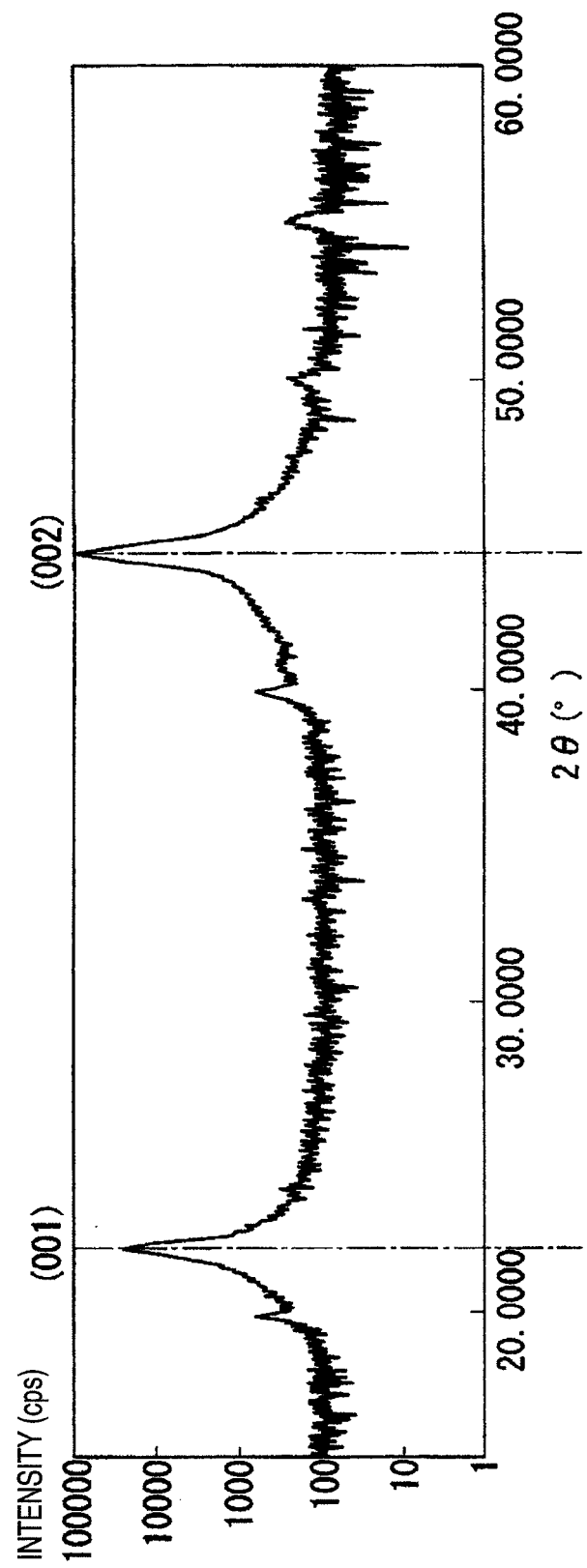
FIG. 7 is a graph showing XRD analysis results for the piezoelectric thin film of the first embodiment of the invention.

The results obtained by analyzing the compositions of the crystal grains 50 and the grain boundaries 51 are shown in FIGS. 5 to 7.

FIG. 5 is a diagram showing a TEM observed image indicating measurement points at which analyses were performed to ascertain the compositions of the crystal grains 50 and of the grain boundaries 51 of the piezoelectric thin film of sample 1 of the invention.

In sample 1, composition analyses were performed at three places, i.e., at points 1 to 3.

Point 1 is located at a distance of 50 nm from a grain boundary 51. Point 2 is located in a grain boundary 51 of about 2 nm, at almost equal distances from the crystal grains 50 that contact this grain boundary 51. Point 3 is located in a crystal grain 50 at a distance of about 5 nm from a grain boundary 51. The diameter of a beam used for element analysis is about 0.5 nm, and this provides satisfactory resolving power for the composition of a grain boundary 51 and enables the performance of an analysis of its composition ratio.

Graphs in FIG. 6 show the results obtained by the ultimate analyses of the piezoelectric thin film for sample 1 of the invention.

As shown in FIG. 6, nearly identical peak profiles are shown for the individual points, and profiles for other elements, which would indicate the presence of foreign substances, were not observed.

Table 1 shows the atomic percents of composite elements Pb, Zr and Ti of PZT that were obtained for the individual points.

TABLE 1

| Atomic percent values of Pb, Zr and Ti at 100% | | | |
|---|---|---|---|
| | Pb | Zr | Ti |
| POINT 1 | 63 | 24 | 13 |
| POINT 2 | 61 | 25 | 14 |
| POINT 3 | 62 | 25 | 13 |

(unit: at %)

For a piezoelectric thin film device 15 of polycrystal, the crystal grains 50 each reproduce the piezoelectric characteristic, and the composition of the piezoelectric thin film device 15 is such that the maximum piezoelectric characteristic is provided. On the other hand, conventionally, since many compositions other than composite elements and other specific elements are present in grain boundaries 51, these elements deteriorate the piezoelectric characteristic exhibited by an entire piezoelectric thin film device 15.

For example, it has been noticed that PbO, which is a Pb compound having a low melting point, is precipitated in PZT, and that because of this precipitation, grain boundary 51 crystallinity is discontinuous, residual strain is increased and reliability is adversely affected.

With reference to the piezoelectric thin film device 15 prepared in sample 1, it is evident that the element composition of the grain boundaries 51 in the piezoelectric thin film 14 is almost the same as the composition of the crystal grains 50, and that while taking measurement errors into account, a composition ratio that provides the piezoelectric characteristic is still included. Thus, the piezoelectric characteristic of the entire piezoelectric thin film device 15 is not disturbed.

Table 2 shows the results of a detailed analysis of the composition ratio of the piezoelectric thin film layer 14, obtained in sample 1, that is made of PZT.

TABLE 2

PZT composition analysis result [atom %]
(excessive Pb volume) (Zr ratio)

| Measurement point | Pb | Zr | Ti | O | Pb/(Zr + Ti) | Zr/(Zr + Ti) |
|---|---|---|---|---|---|---|
| 1 | 21.9 | 11 | 8.7 | 58.4 | 1.11 | 55.84 |
| 2 | 22 | 11.1 | 8.7 | 58.1 | 1.11 | 56.06 |
| 3 | 22.1 | 11 | 8.7 | 58.1 | 1.12 | 55.84 |
| 4 | 22.1 | 11.1 | 8.8 | 58 | 1.11 | 55.78 |
| 5 | 22.1 | 11.2 | 8.8 | 58 | 1.11 | 56.00 |
| Average value | 22 | 11.1 | 8.7 | 58.1 | 1.11 | 55.90 |

According to Table 2, it is found that an excessive volume of Pb is contained in the piezoelectric thin film of sample 1. When the results in Table 2 and the results in Table 1 and in FIG. 6 are collected together, it can be deduced that the excessive volume of Pb is contained in the crystal grains 50 and the grain boundaries 51 that constitute the piezoelectric thin film layer 14.

Compared with the mol ratio in site B where Zr and Ti are contained, it is preferable that the excessive volume of Pb be in the range of $1.0<Pb/(Zr+Ti)<1.4$.

When the volume of Pb is reduced below 1.0, and subsequently becomes too little, crystallinity is deteriorated. And when the amount of Pb exceeds 1.4, it is turned into PbO and is thereafter precipitated in the grain boundaries 51, and this precipitated material serves as a path for current leakage when a voltage is applied. As a result, the voltage resistance characteristic is remarkably deteriorated.

In addition, when the ratio of Zr to Ti is $0.3<Zr/(Zr+Ti)<0.7$, a satisfactory piezoelectric characteristic is maintained.

According to an analysis of the piezoelectric thin film in sample 1, the composition of the grain boundaries 51 is substantially the same as the composition of the crystal grains 50, and through a composition analysis, a uniform composition distribution is obtained for which there is less variance at the individual points.

Furthermore, the XRD analysis was performed in order to measure the orientation of the piezoelectric thin film obtained for sample 1. For the XRD analysis, the 0-20 method was employed using RINT-Ultima III produced by Rigaku Corporation.

FIG. 7 is a graph showing the XRD analysis results for the piezoelectric thin film according to sample 1 of the invention.

As shown in FIG. 7, as for the orientation plane of the PZT film, which is the piezoelectric thin film, a peak other than the (001) peak, for example, either the (111) or (101) peak, is not observed, and other tiny peaks that are significant at the PZT (001) peak intensity ratio are also not observed.

The pyrochlore phase or the other orientation peak of the composite element is not observed in any part of the area of the piezoelectric thin film, and the polycrystal piezoelectric thin film is provided wherein the crystal orientation matches for the crystal grains 50 and the grain boundaries 51, i.e., a single (001) orientation is established. Further, in order to evaluate the orientation of the currently formed piezoelectric thin film, the peak intensity was examined at five points by performing the XRD analysis. For comparison, a single crystal thin film was deposited by forming Pt and PZT thin films on the MgO substrate through epitaxial growth, and the peak intensity was measured for the single crystal thin film. The thickness of the epitaxial PZT film was the same as that of the polycrystal thin film, the orientation was also a (001) single orientation; the other peak was not observed.

Table 3 shows the results obtained when the peak intensity of the (001) orientation was measured for the piezoelectric thin film formed by epitaxial growth and the piezoelectric thin film of sample 1, while the measurement conditions of the XRD analysis was identical.

TABLE 3

| Crystal structure of piezoelectric thin film | (001) peak intensity (cps) |
|---|---|
| Sample 1 (polycrystal, single peak) | 75,600 to 81,500 |
| Epitaxial film (single crystal) | 450,560 to 500,420 |

The piezoelectric thin film obtained by epitaxial growth is a single crystal thin film, the orientation is remarkably superior, and the peak intensity is very high.

Between the thin film (the single crystal film) formed by epitaxial growth and the conventional polycrystal thin film, there was previously a difference of about two digits, at the least, in the peak intensity. However, as shown in Table 3, according to the piezoelectric thin film (polycrystal) formed in sample 1, the crystal orientation was very satisfactory, and an intensity ratio of 0.15 or higher, relative to the single crystal film, was obtained. Based on these results, it was felt that piezoelectric characteristics and electric characteristics near those of a single crystal can also be obtained. Specifically, it was superior in that the domain tracks the applied voltage, and the linearity of the hysteresis of the piezoelectric characteristics relative to the applied voltage was improved.

Following this, in order to evaluate the piezoelectric characteristic of the piezoelectric thin film obtained in sample 1, the structure in the state before the second electrode layer 16 was formed was employed, and was cut, by dicing, into ten cantilevers of 15 mm×2 mm. Thereafter, the second electrode layer 16 of 0.2 μm thick was deposited by sputtering, and the piezoelectric constant d31 was measured (the measurement method of the piezoelectric constant d31 is described, for example, in JP-A-2001-021052).

As for the conventional polycrystal, since the migration of the domain is interrupted by the orientation of the grain boundaries 51 or foreign substances, the piezoelectric constant is small in a low voltage applied state, or is great in a high voltage applied state. The piezoelectric constant d31 varies depending on the composition of a piezoelectric thin film and the fabrication conditions, and may be changed by about 30% relative to a voltage. For piezoelectric thin film that has a high voltage dependency, reproducibility is also inferior when a voltage hysteresis was repetitively added. In order to compare the voltage dependency of the piezoelectric constant in sample 1 with the voltage, a value was calculated using the following (expression 1).

$$100 \times \{(d31(\text{maximum value}) - d31(\text{minimum value}))/(d31(\text{maximum value}) + d31(\text{minimum value}))\} \quad \text{(Expression 1)}$$

Table 4 shows the measurement value of the piezoelectric constant d31, relative to a voltage, of the piezoelectric thin film formed in sample 1, and the calculation results for the voltage dependency.

TABLE 4

| Cantilever No. | Applied voltage | | | | | | 100 × (d31 (max. value) − d31 (min. value))/(d31 (max. value) + d31 (min. value)) |
|---|---|---|---|---|---|---|---|
| | −5 V | −10 V | −15 V | −20 V | −30 V | −35 V | |
| 1 | 140.2 | 145.1 | 153.4 | 158.3 | 161.8 | 165.4 | 8.2 |
| 2 | 135.1 | 141.2 | 152.3 | 155.4 | 160.3 | 162.6 | 9.2 |
| 3 | 167.3 | 172.3 | 177.8 | 183.5 | 185.2 | 186.8 | 5.5 |
| 4 | 140.2 | 145.6 | 147.5 | 150.2 | 150.9 | 151.8 | 4.0 |
| 5 | 142.8 | 145.3 | 148.2 | 149.6 | 152.3 | 155.4 | 4.2 |
| 6 | 144.2 | 146.3 | 149.3 | 151.2 | 155.6 | 158.3 | 4.7 |
| 7 | 148.2 | 150.3 | 155.3 | 164.3 | 168.9 | 170.2 | 6.9 |
| 8 | 155.3 | 158.9 | 162.3 | 170.5 | 174.6 | 176.4 | 6.4 |
| 9 | 140.6 | 144.2 | 152.3 | 159.6 | 163.2 | 167.8 | 8.8 |
| 10 | 156.4 | 160.3 | 165.3 | 171.3 | 174.8 | 177.7 | 6.4 |

The piezoelectric thin film obtained in sample 1 had a low dependency, relative to a voltage, for the piezoelectric constant d31, and was superior in reproducibility using voltage hysteresis.

Second Embodiment

Figure 8:
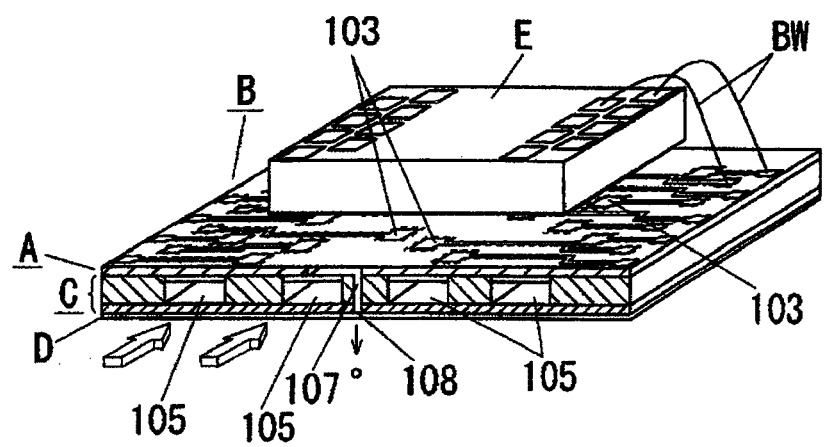
FIG. 8 is a structure diagram illustrating the general arrangement of an inkjet head according to a second embodiment of the present invention.

FIG. 8 is a diagram showing the general arrangement of inkjet head according to a second embodiment of the present invention.

Figure 9:
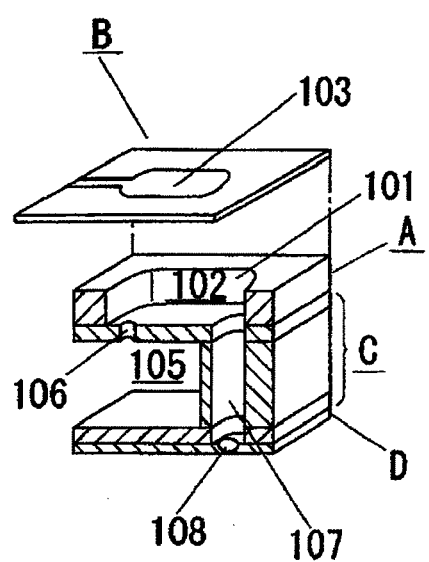
FIG. 9 is an essential structural diagram showing the structure of the essential section of the inkjet head of the second embodiment of the invention.

FIG. 9 is an essential structural diagram showing the structure of the essential section of the inkjet head of the second embodiment of the invention.

The structure of the inkjet head for the second embodiment will now be described while referring to FIGS. 8 and 9.

In FIGS. 8 and 9, a pressure chamber opening 101 is formed that passes through a pressure chamber member A in the direction of thickness (the vertical direction), and an actuator B and an ink flow member C are positioned to respectively cover the upper mouth and the lower mouth of the pressure chamber opening 101. Thus, by closing the top of the pressure chamber opening 101 with the actuator B and the bottom with the ink flow path member C, a pressure chamber 102 is constituted.

The actuator B includes multiple first electrode layer segments 103 (individual electrodes), which are individually located immediately above multiple pressure chambers 102. As shown in FIG. 8, the pressure chambers 102 and the first electrode layer segments 103 are arranged in a zigzag manner.

The ink flow path member C includes: a common liquid chamber 105, used in common by the pressure chambers 102 arranged in the direction in which ink is to be supplied; supply ports 106, used to supply ink from the common liquid chamber 105 to the pressure chambers 102; and ink flow paths 107, used to eject ink in the pressure chambers 102.

Nozzle holes 108 that communicate with the ink flow paths 107 are formed in a nozzle plate D. An IC chip E supplies a voltage to the individual electrodes 103 via bonding wires BW.

Figure 10:
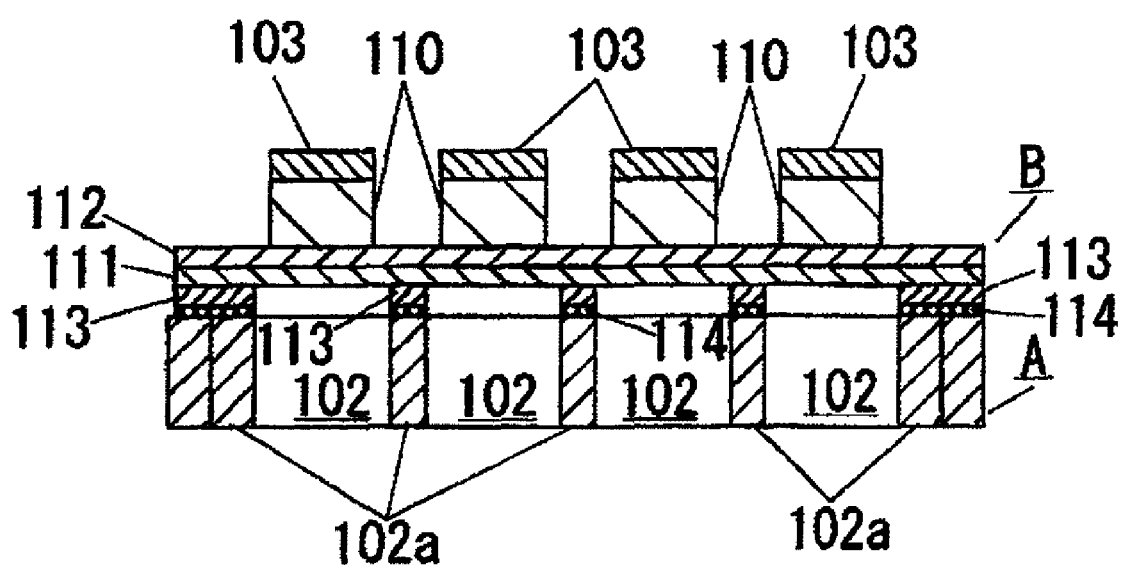
FIG. 10 is a structural diagram showing the structure of an actuator according to the second embodiment of the invention.

FIG. 10 is a diagram showing the structure of the actuator B according to the second embodiment.

The cross section shown in FIG. 10 is taken along a direction perpendicular to the ink supply direction shown in FIG. 8.

The structure of the actuator B will now be described while referring to FIG. 10.

While referring to FIG. 10, the pressure chamber member A includes four pressure chambers 102 arranged perpendicularly.

The actuator B includes: the first electrode layer segments 103 that are positioned almost above the individual pressure chambers 102, as described above; orientation control layer segments 104 that are arranged on (in FIG. 10, "under") the individual first electrode layer segments 103; piezoelectric thin film layer segments 110 on (also in FIG. 10, "under") the orientation control layer segments 104; a second electrode layer 112 (common electrode) that is located on (also in FIG. 10, "under") the piezoelectric thin film layer segments 110 and is used in common for all the piezoelectric thin film layer segments 110; a vibration plate 111 that is located on (also "under") the second electrode layer 112 and that is displaced and vibrates in the direction of thickness due to the piezoelectric effect of the piezoelectric thin film layer segments 110; and intermediate layers (vertical walls) 113 that are located on (also "under") the vibration plate 111 and above partition walls 102*a* that define the pressure chambers 102. The first electrode layer segments 103, the piezoelectric thin film layer 110 and the second electrode layer 112 are laminated sequentially to construct a piezoelectric thin film device.

Further, the vibration plate 111 is arranged on the face of the piezoelectric thin film device, on the second electrode layer 112 side, so that internal stress becomes compressive stress. And the compressive stress for the vibration plate 111 is set to a predetermined value so that other constituent material, especially the piezoelectric thin film layer 110, does not suffer any adverse affects, such as cracking.

Further, the total of the internal stress for the piezoelectric thin film device, which is formed of the piezoelectric thin film layer 110 deposited on the vibration plate 111, and the internal stress for the vibration plate 111 is set as the compressive stress of the vibration plate 111. When the internal stress for the piezoelectric thin film device is tensile stress, the compressive stress for the vibration plate 111 should be increased, so that the total of the stresses for the two layers is equal to the compressive stress. On the other hand, when the internal stress for the piezoelectric thin film device is the compressive stress, it is preferable that the internal stress for the vibration plate 111 be set to 0 or to a low compressive stress.

When the internal stress for the vibration plate 111 is set equal to the compressive stress, the piezoelectric thin film device becomes resistant to a peel-back force that is exerted by mechanical shrinkage due to the application of a voltage, and peeling and cracking can be prevented.

Further, since the total of the internal stresses for the piezoelectric thin film device and at the vibration plate 111 is set as the compressive stress, an effect can be anticipated that provides improved reliability, such as an increase in the adhesiveness of the individual layers.

In FIG. 10, an adhesive 114 is used to adhere the pressure chamber member A to the actuator B. The intermediate layers 113 are arranged to extend the distance between the open top levels of the pressure chambers 102 and the lower face of the vibration plate 111. Therefore, during the bonding process using the adhesive 114, the part of the adhesive 114 that overflows outside the partition walls 102a does not stick to the vibration plate 111, and the vibration plate 111 can be displaced and vibrate as anticipated. As described above, it is preferable that the pressure chamber member A be bonded, via the intermediate layer 113, to the face of the vibration plate 111 of the actuator B opposite the second electrode layer 112. However, the pressure chamber member A may be bonded directly to the face of the vibration plate 111 opposite the second electrode layer 112.

The materials for the first electrode layer 103, the piezoelectric thin film layer 110 and the second electrode layer 112 are the same as those for the first electrode layer 13, the piezoelectric thin film layer 14 and the second electrode layer 16 described in the first embodiment (see FIG. 1) (For some materials, the contents of the composite elements are different). Further, the vibration plate 111 is formed of a thin film of a metal, such as Cu, Cr or Ti, or an oxide ceramic, such as oxide zirconium.

While referring to FIGS. 11 to 15, an explanation will now be given for a method for manufacturing an inkjet head excluding the IC chip E in FIG. 8, i.e., an inkjet head that includes the pressure chamber member A, the actuator B, the ink flow path member C and the nozzle plate D shown in FIG. 9.

Figure 11A:
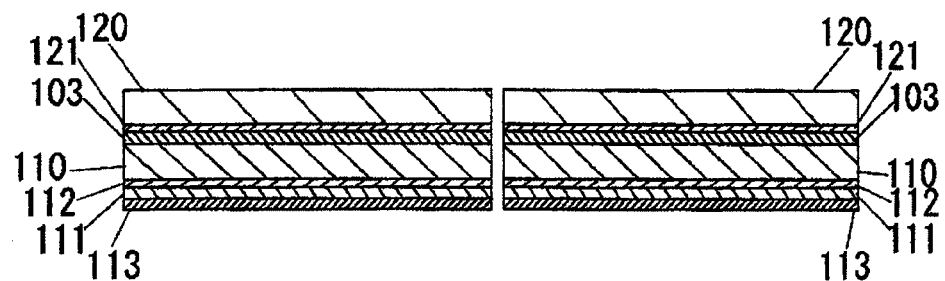
FIGS. 11A to 11C are diagrams for explaining a lamination step, a formation step for an opening serving as a pressure chamber and an adhesive attachment step, which are processing steps included in an inkjet head manufacturing method according to the second embodiment of the invention.
Figure 11B:
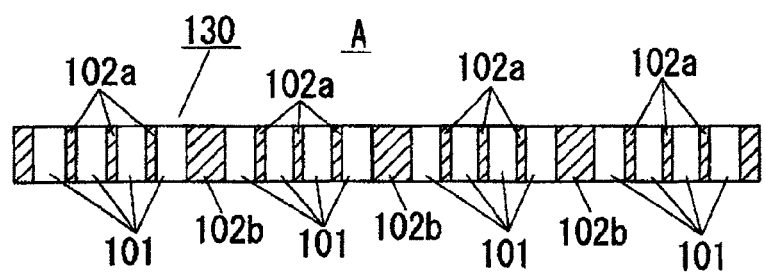
Figure 11C:
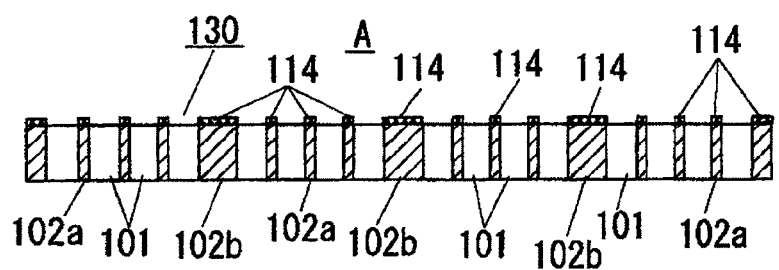

FIGS. 11A to 11C are explanatory diagrams showing a layer lamination step, a formation step for the pressure chamber opening 101 and a bonding step for the adhesive 114, which are included in an inkjet head manufacturing method according to the second embodiment of the invention.

As shown in FIG. 11A, an adhesive layer 121, the first electrode layer 103, the piezoelectric thin film layer 110, the second electrode layer 112, the vibration plate 111 and the intermediate layer 113 are sequentially deposited on each substrate 120 using sputtering and are laminated. The adhesive layer 121 is the same as the adhesive layer 12 (see FIG. 1) explained in the first embodiment, and is formed between the substrate 120 and the first electrode layer 103 in order to increase the contact between the substrate 120 and the first electrode layer 103 (when a satisfactory adhesiveness for the two is obtained, the adhesive layer 121 need not always be formed). As will be described later, the portions of the adhesive layer 121 unnecessary for constructing an inkjet head are removed, as well as those of the substrate 120. Further, Cr is employed as the material of the vibration plate 111, and Ti is employed for the intermediate layer 113.

Si substrates of 18 mm square are employed as the substrates 120. The composition used for a substrate 120, however, is not limited to Si; a glass, a metal or a ceramic may be used. Furthermore, the Si substrate size need not merely be an 18 mm square; so long as an Si substrate is used, a wafer of φ2 to 10 inches may be employed.

In order to provide a piezoelectric thin film device, the same steps as those in the first embodiment are employed to form layers, beginning with the adhesive layer 121.

The vibration plate 111 is obtained by using a Cr target and applying 200 W high-frequency AC power in argon gas at 0.3 Pa, at room temperature for 150 minutes. The film thickness of the vibration plate 111 is 3 μm, and the internal stress for the vibration plate 111 is adjusted in accordance with the film formation condition for sputtering. When whether the internal stress is compressive or not is to be identified, a dummy Si substrate is also formed during the film formation process and is thereafter extracted, and the warpage of the substrate is measured. Before film formation, the warpage of the dummy Si substrate is measured in advance. Then, after the film formation, since convex warpage becomes the compressive stress when the face on which the film is formed is turned upward, the warpage before the film formation is subtracted, and the remaining convex warpage is the compressive stress.

Since the internal stress can be calculated based on the warpage, the internal stress can be adjusted in accordance with the film formation conditions. Generally, according to the sputtering performed, since the compressive strain is easily obtained when the Ar implantation energy is great, the compressive stress is adjusted by controlling the gas pressure or the parameters for producing power. The sum of the internal stresses for the piezoelectric thin film device and the vibration plate 111 is calculated using the same method as described above.

The total internal stress can be estimated based on the initial warpage of the substrate 120 and the warpage obtained after the vibration plate 111 has been laminated. Generally, adjustment of the internal stress of the piezoelectric thin film is difficult because a high-temperature process has been performed, and depending on the stress for the vibration plate 111, the compressive stress is designated as the internal stress. The material used for the vibration plate 111 is not only Cr, but may be nickel, aluminum, tantalum, tungsten, silicon, or an oxide or a nitride of them (e.g., silicon dioxide, aluminum oxide, zirconium oxide or silicon nitride). Further, the film thickness of the vibration plate 111 may be 0.5 to 10 μm.

The intermediate layer 113 is obtained by using a Ti target and applying a 200 W high-frequency AC power, in argon gas at 1 Pa, at room temperature for five hours. In the second embodiment, the film thickness of the intermediate layer 113 is 5 μm, and the material used for the intermediate layer 113 is not limited to Ti but may be an arbitrary conductive material, such as Cr. Further, the film thickness of the intermediate layer 113 may be from 3 to 10 μm.

Figure 16:
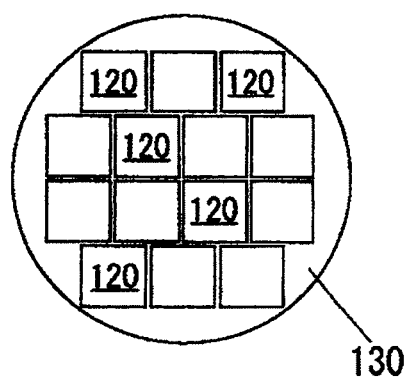
FIG. 16 is a plan view of a silicon substrate used for manufacturing an inkjet head according to the second embodiment.

FIG. 16 is a plan view of a silicon substrate 130, employed for the manufacture of an inkjet head, according to the second embodiment of the invention.

The explanation of the manufacturing method will be continued by together employing FIG. 16 and FIG. 11B.

After the individual layers have been deposited in the above described manner, a pressure chamber member A is formed as shown in FIG. 11B. The pressure chamber member A is provided by employing a substrate the size of which is greater than the Si substrate 120, e.g., the silicon substrate 130 (see FIG. 16), which is a 4 inch wafer.

Specifically, a plurality of pressure chamber openings 101 are patterned in the silicon substrate 130 (pressure chamber member A). As is apparent from FIG. 11B, for this patterning, four pressure chamber openings 101 are regarded as one set, and partition walls 102b that define the individual sets are designated that are twice as wide (thick) as the partition walls 102a that define the pressure chamber openings 101 of each set. Thereafter, the thus patterned silicon substrate 130 is processed using either chemical etching or dry etching, and the pressure chamber member A is obtained wherein four pressure chamber openings 101 have been formed for each set.

Sequentially, then, using the adhesive 114, which is a resin, the substrates 120 (used for film formation), on which the Si film has been formed, and the pressure chamber member A are bonded together. Electrodeposition is employed to apply the adhesive 114.

Specifically, first, as shown in FIG. 11C, the adhesive 114 is applied by electrodeposition to the upper faces of the partition walls 102a and 102b of the pressure chambers, which are contact faces on the pressure chamber member A side. Specifically, although not shown, to the upper surface of the portion walls 102a and 102b an Ni thin film that serves as an underlayer electrode film is formed, by sputtering, that has a thickness of only several hundreds of Å, which permits light to pass through, and then, the patterned adhesive 114 is formed on the Ni thin film. Thereafter, pure water of 0 to 50 parts by weight is added to and mixed well with an acrylic resin, water dispersed liquid, and the resultant solution is employed as an electrodeposition liquid. The Ni film is formed thin enough to permit light to pass through, because then it can be easily seen that the adhesive (adhesive resin) 114 has been properly applied to the silicon substrate 130 (used as the pressure chamber member).

According to experiments that were run, the appropriate electrodeposition condition is a liquid temperature of about 25° C., a direct-current voltage of 30 V and a voltage application period of 60 seconds. Under these conditions, an acrylic resin of about 3 to 10 μm is formed on the Ni thin film of the silicon substrate 130 (for a pressure chamber member) by electrodeposition.

Figure 12A:
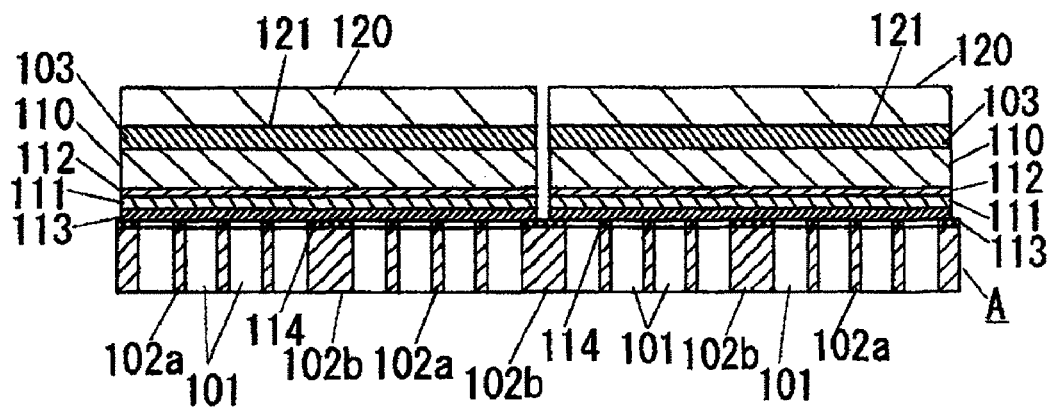
FIGS. 12A and 12B are diagrams for explaining a bonding step for a substrate and a pressure chamber member, after film deposition has been completed, and a formation step for vertical walls, which are steps that are included in the inkjet head manufacturing method according to the second embodiment of the invention.
Figure 12B:
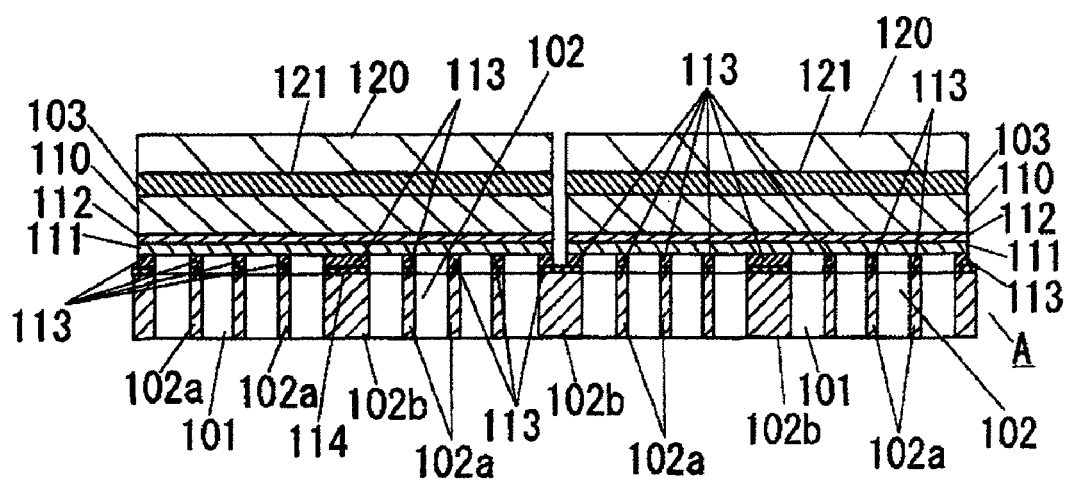

FIGS. 12A and 12B are explanatory diagrams showing a bonding step for the pressure chamber member A and the substrates 120 after the film formation has been completed, and a formation step for vertical walls, which are included in the inkjet head manufacturing method according to the second embodiment.

As shown in FIG. 12A, the substrates 120 (for film formation) on which the Si is formed are bonded to the pressure chamber member A using the adhesive 114 applied by electrodeposition. For this bonding, the intermediate layers 113 formed on the substrates 120 (for film formation) are employed as the contact faces of the substrates. Since the substrates 120 (for film formation) on which the Si is formed are 18 mm squares and the silicon substrate 130 that serves as the pressure chamber member A is large, i.e., a four inch square, a plurality (e.g., 14 silicon substrates in FIG. 16) of substrates 120 (for film formation) are adhered to a single pressure chamber A (silicon substrate 130), as shown in FIGS. 12A and 12B. This adhering process is performed so that, as shown in FIG. 12B, the centers of the individual substrates 120 (for film formation) are centrally located above the centers of the thick partition walls 102b of the pressure chamber member A.

After this adhesion has been completed, the pressure chamber member A is pressed against the substrates 120 (for film formation) to increase the contact pressure between the two.

Further, the substrates 120 (for film formation) and the pressure chamber member A closely adhered together are gradually heated in a heating furnace, and the adhesive 114 is completely cured. Sequentially, then, plasma treatment is performed to remove the part of the adhesive 114 that had overflowed.

Referring to FIG. 12A, the substrates 120 (for film formation) on which the film has been deposited and the pressure chamber member A have been bonded; however, the silicon substrate 130 (for a pressure chamber member), before the pressure chamber openings 101 are formed, may be adhered to the substrates 120 (for film formation) on which the Si is formed.

Thereafter, as shown in FIG. 12B, the intermediate layers 113 are etched by employing, as masks, the partition walls 102a and 102b of the pressure chamber member A, and a predetermined shape is obtained (the intermediate layers 113 are so shaped (like vertical walls) that it is continued to the partition walls 102a and 102b).

Figure 13A:
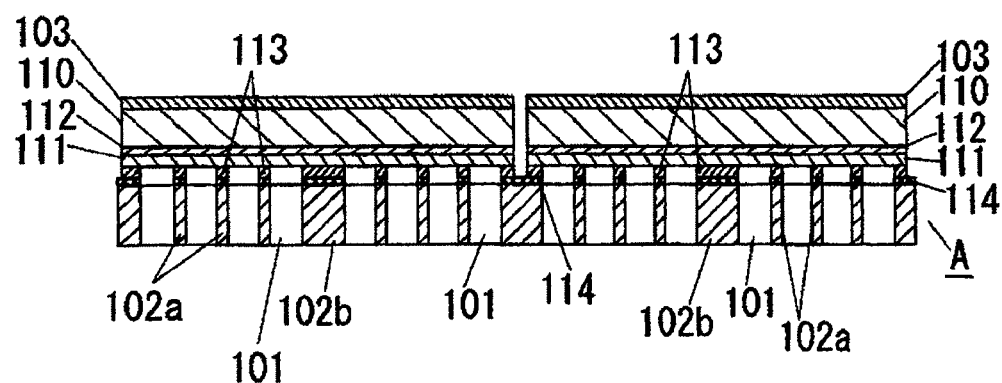
FIGS. 13A and 13B are diagrams for explaining a removal step for the substrate (for film deposition) and adhesive layers and a segmentation step performed for a first electrode layer to obtain individual electrodes, which are processing steps included in the inkjet head manufacturing method according to the second embodiment of the invention.
Figure 13B:
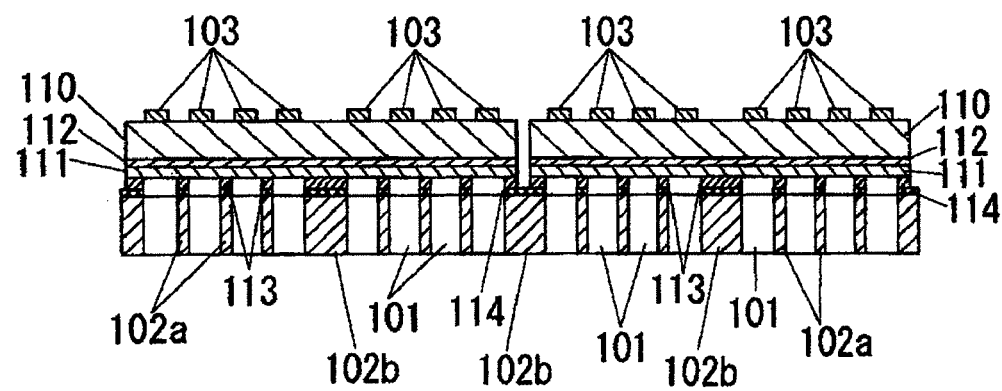

FIGS. 13A and 13B are explanatory diagrams for the inkjet head manufacturing method according to the second embodiment, i.e., the step of removing the substrate 120 (for film formation) and the adhesive layer 121 and the step of segmenting the first electrode layer 103 for the individual pressure chambers 102.

As shown in FIG. 13A, the substrate 120 (film formation) and the adhesive layer 121 are removed by etching.

Following this, as shown in FIG. 13B, the first electrode layer 103, positioned above the pressure chamber member A, is etched using photolithography, and is segmented for the individual pressure chambers 102.

Figure 14A:
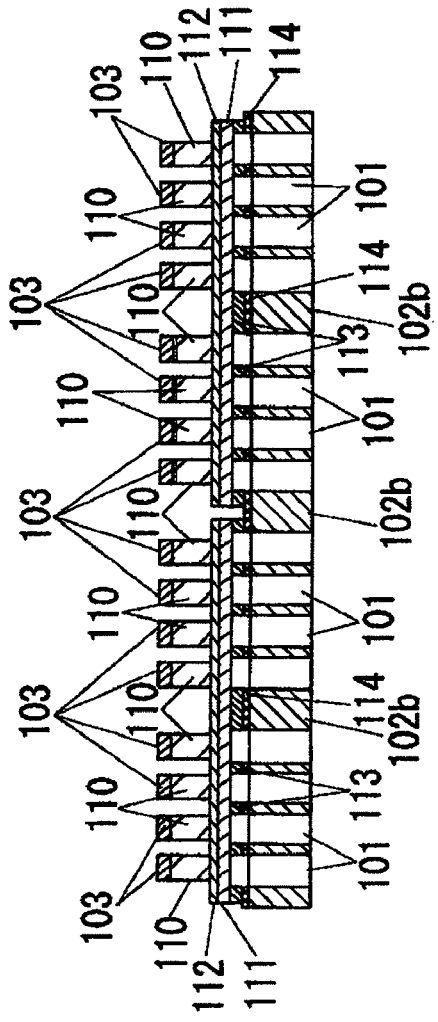
FIGS. 14A and 14B are diagrams for explaining a segmentation step for a piezoelectric thin film layer and a cutting step for a silicon substrate (for a pressure chamber member), which are processing steps included in the inkjet head manufacturing method according to the second embodiment of the invention.
Figure 14B:
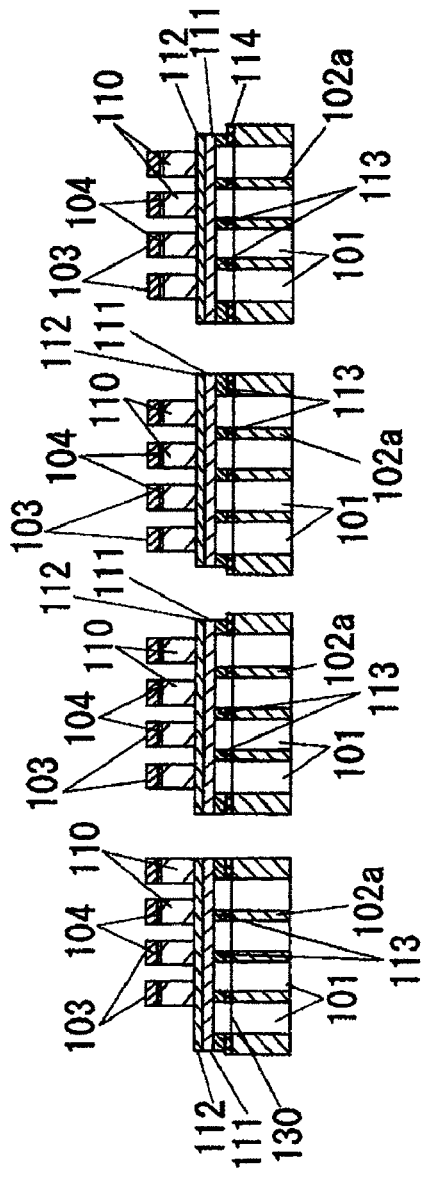

FIGS. 14A and 14B are explanatory diagrams showing a segmentation step for the piezoelectric thin film layer 110 and a cutting step for the silicon substrate 130 (for a pressure chamber member), which are included in the inkjet head manufacturing method according to the second embodiment of the invention.

As shown in FIG. 14A, the piezoelectric thin film layer 110 is etched using photolithography, and is segmented, to provide the same shape as that obtained for the first electrode layer 103. After the first electrode layer 103 and the piezoelectric thin film layer 110 have been etched, the obtained segments are positioned above the individual pressure chambers 102, and the widthwise centers of these segments accurately match the widthwise centers of the corresponding pressure chambers 102. When in this manner the first electrode layer 103 and the piezoelectric thin film layer 110 are segmented for the individual pressure chambers 102, the silicon substrate 130 (for a pressure chamber member) is cut along the thick partition walls 102b, as shown in FIG. 14B. As a result, four sets of pressure chamber members A, each having four pressure chambers 102, and actuators B securely attached to the upper faces thereof are completed.

FIGS. 15A to 15D are explanatory diagrams showing a generation step for the ink flow path member C and the nozzle plate D, an adhering step for the ink flow path member C and the nozzle plate D and an adhering step for the pressure chamber member A and the ink flow path member C, which are included in the inkjet head manufacturing method according to the second embodiment of the invention, and also showing an inkjet head that is completed by using this method.

Figure 15A:
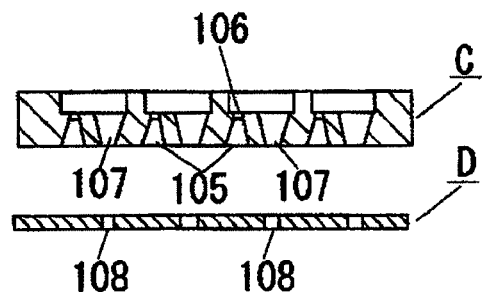
FIGS. 15A to 15D are diagrams for explaining a forming step for an ink flow path member and a nozzle plate, a bonding step for the ink flow path member and the nozzle plate and a bonding step for the pressure chamber member and the ink flow path member, which are processing steps included in the inkjet head manufacturing method according to the second embodiment of the invention, and for showing a completed inkjet head.
Figure 15B:
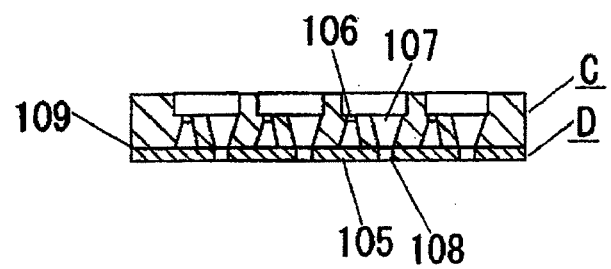

As shown in FIG. 15A, the common liquid chamber 105, the supply port 106 and the ink flow paths 107 are formed in the ink flow path member C, and the nozzle holes 108 are formed in the nozzle plate D. Then, as shown in FIG. 15B, the ink flow path member C and the nozzle plate D are bonded together using an adhesive 109.

Figure 15C:
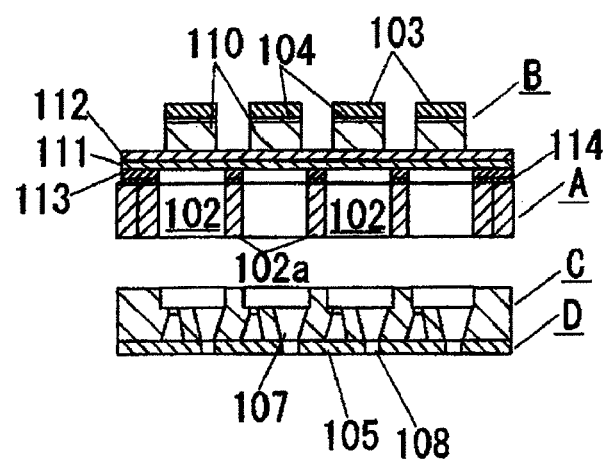

Sequentially, as shown in FIG. 15C, an adhesive (not shown) is transferred to the lower end face of the pressure chamber member A, or the upper end face of the ink flow path member C, and the pressure chamber member A is aligned with the ink flow path member C and the two members are bonded together by an adhesive (not shown).

Figure 15D:
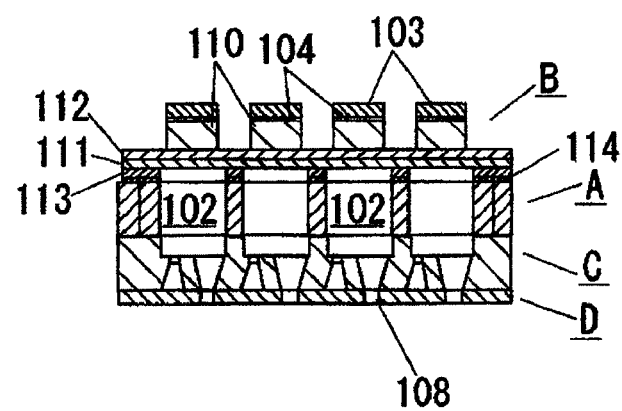

Through this processing, as shown in FIG. 15D, an inkjet head that includes the pressure chamber member A, the actuators B, the ink flow path member C and the nozzle plate D is completed.

Third Embodiment

Figure 17:
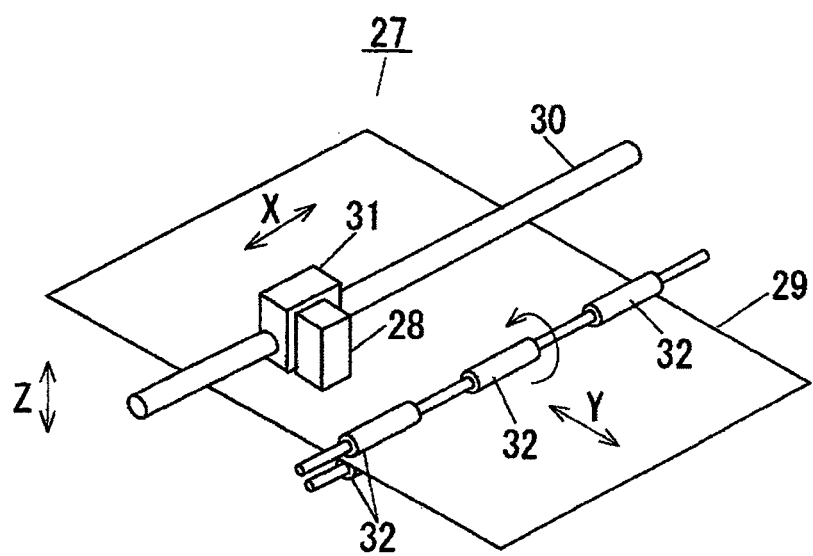
FIG. 17 is a diagram showing the structure of an inkjet recording apparatus according to a third embodiment of the present invention.

FIG. 17 is a diagram showing the structure of an inkjet recording apparatus 27 according to a third embodiment of the present invention.

The inkjet recording apparatus 27 includes the same inkjet head 28 as described in detail for the second embodiment. To perform recording using the inkjet head 28, nozzle holes (nozzle holes 108, explained in the second embodiment) are formed that communicate with pressure chambers (pressure chambers 102, explained for the second embodiment), and ink in the pressure chambers 102 is discharged through the nozzle holes 108 onto a recording medium 29, such as a recording sheet.

The inkjet head 28 is mounted on a carriage 317 which is fitted over a carriage shaft 30 that is extended in the main scanning direction X in FIG. 17, and is moved forward and backward, in the main scanning direction X, in consonance with the reciprocal movement of the carriage 31 along the carriage shaft 30. With this arrangement, the carriage 31 serves as relative moving means that moves the inkjet head 28, relative to the recording medium 29, in the main scanning direction X.

Further, the inkjet recording apparatus 27 includes a plurality of rollers 32 that move the recording medium 29 in the sub-scanning direction Y, which is nearly perpendicular to the main scanning direction X (the widthwise direction) of the inkjet head 28. With this arrangement, the plurality of rollers 32 serve as relative moving means for moving the inkjet head 28, relative to the recording medium 29, in the sub-scanning direction Y. It should be noted that in FIG. 10 a vertical direction Z is a direction perpendicular to either the main scanning direction X or the sub-scanning direction Y.

While the inkjet head 28 is being moved by the carriage 31 in the main scanning direction X, ink is ejected onto the recording medium 29 through the nozzle holes in the inkjet head 28, and when the recording for one scan has been completed, the recording medium 29 is moved by the rollers 32 a predetermined distance, and the recording for the next scan is performed.

As described above, the first to third embodiments include the following features.

A piezoelectric thin film device according to the embodiments is a piezoelectric thin film device provided by forming a piezoelectric thin film between electrodes, wherein the piezoelectric thin film includes crystal grains and grain boundaries that are formed between the crystal grains, and wherein the same crystal orientation is established for the grain boundaries and the crystal grains.

With this arrangement, when a voltage is applied, migration of a domain can be smoothly performed, and satisfactory piezoelectric characteristics are obtained.

Furthermore, for the piezoelectric thin film device according to the embodiments, the piezoelectric thin film is formed of polycrystal, for which a (001) single orientation of crystal grains is obtained.

With this arrangement, upon the application of a voltage, a domain is migrated only a short distance, and another peak is not present. Thus, satisfactory piezoelectric characteristics can be obtained.

Further, for the piezoelectric thin film device according to the embodiments, a columnar crystal is employed, so that crystal grains grow, beginning with one end attached to an electrode, substantially in the perpendicular direction.

With this arrangement, a crystal structure appropriate for exhibiting the piezoelectric characteristics can be obtained.

In addition, for the piezoelectric thin film device according to the embodiments, the sizes of the crystal grains are set as 0.02 to 0.5 μm, and the widths of the grain boundaries are set as 1 to 5 nm.

With this arrangement, the crystal grains are closely arranged, and the widths of the grain boundaries are controlled within a narrow range. Therefore, a crystal structure superior to the piezoelectric characteristics is obtained.

Also, for the piezoelectric thin film device according to the embodiments, the ratio of a crystal orientation peak intensity for the piezoelectric thin film is equal to or greater than 0.15, relative to a crystal orientation peak intensity for a single crystal thin film, which has the same thickness as the piezoelectric thin film and for which a (001) single orientation is established.

With this arrangement, the piezoelectric thin film composed of polycrystal obtains a crystal structure superior in orientation, and attains characteristics that are similar to those of a piezoelectric thin film composed of single crystal.

Moreover, for the piezoelectric thin film device according to the embodiments, each of the grain boundaries, which are defined between the crystal grains that form the piezoelectric thin film, contains, at the least, the composite elements of the crystal grains and employs a composition ratio that provides the piezoelectric characteristics.

With this arrangement, a foreign substance that interferes with the piezoelectric characteristics does not exist in the grain boundaries, and a crystal structure is obtained that is superior in the reproduction of satisfactory piezoelectric characteristics and in providing the voltage resistance characteristic.

Furthermore, for the piezoelectric thin film device according to the embodiments, the piezoelectric thin film is made of an oxide having a perovskite structure that contains Pb, Zr and Ti.

As a result, a composition and a crystal structure that exhibit superior piezoelectric characteristics can be provided.

Further, for the piezoelectric thin film device according to the embodiments, the composition ratio for Zr is set as $0.3 < Zr/(Zr+Ti) < 0.7$.

As a result, a composition that provides excellent piezoelectric characteristics can be obtained.

For the piezoelectric thin film device according to the embodiments, the composition ratio of Pb is set as $1 < Pb/(Zr+Ti) < 1.4$.

As a result, the deterioration of a crystal structure due to the separation of Pb during film formation can be prevented, and excellent piezoelectric characteristics can be exhibited.

In addition, for the piezoelectric thin film device according to the embodiments, the piezoelectric thin film is formed by a vapor phase growth method, such as sputtering, vacuum evaporation, laser ablation, ion plating, MBE, MOCVD or plasma CVD.

Since by employing such a method the crystal growth and the thickness of a piezoelectric thin film can be accurately controlled, a piezoelectric thin film having superior piezoelectric characteristics and withstand voltage characteristics can be formed.

Also, for the piezoelectric thin film device according to the embodiments, a piezoelectric constant d31 for the piezoelectric thin film is set so as to change, relative to the hysteresis of an applied voltage, within a range of $0 \leq 100 \times \{(d31 \text{ (maximum value)} - d31 \text{ (minimum value)})/(d31 \text{ (maximum value)} + d31 \text{ (minimum value)})\} < 10$.

Thus, a piezoelectric thin film device is obtained for which the piezoelectric characteristics have low dependency relative to a voltage, the displacement can be easily controlled and the reproducibility is superior.

An inkjet head according to the embodiments includes: a vibration plate film, which is deposited on an arbitrary electrode-side face of the above described piezoelectric thin film device; a pressure chamber member, which is bonded to the face of the vibration plate film opposite the piezoelectric thin film device and which has pressure chambers for storing ink; and wherein, through the piezoelectric effects of the piezoelectric thin film device, the vibration plate film is displaced in the direction of the thickness to eject ink from the pressure chambers.

With this arrangement, an inkjet head that is easily controlled and provides a superior ejection function is obtained.

Moreover, the inkjet head according to the embodiments includes a vibration plate that is laminated on one of the electrodes, so that the internal stress of the vibration plate can be employed as compressive stress.

With this arrangement, the characteristics of the piezoelectric thin film device are appropriately exhibited and a reliable inkjet head can be obtained.

Further, for the inkjet head according to the embodiments, the internal stress of the vibration plate is so set that the total of the internal stress of the vibration plate and the internal stress of the piezoelectric think film device, obtained by lamination, becomes compressive stress.

With this arrangement, an inkjet head can be provided that possesses superior withstand voltage characteristics and the reliability required for long-term driving.

Furthermore, the inkjet recording apparatus according to the embodiments includes: a relative moving unit, for moving the above described inkjet head relative to a recording medium, wherein when the inkjet head is being moved relative to the recording medium by the relative moving unit, the inkjet head performs recording by ejecting ink, which is stored in pressure chambers, onto the recording medium through nozzles that communicate with the pressure chambers.

With this arrangement, a reliable, efficiently functioning inkjet recording apparatus can be provided.

According to the embodiments, a method for manufacturing a piezoelectric thin film device includes the steps of:

forming a first electrode layer on a substrate;

forming a piezoelectric thin film layer on the first electrode layer using sputtering; and forming a second electrode layer on the piezoelectric thin film layer, and wherein, at the step of forming the piezoelectric thin film layer, the substrate is heated in order to obtain a predetermined crystal orientation.

With this arrangement, when a piezoelectric thin film is formed, a predetermined crystal orientation is obtained at the same time, so that the composition of the crystal grains can match the composition of the grain boundary.

In addition, according to the embodiments, for the piezoelectric thin film device manufacturing method, the piezoelectric thin film layer is formed using a sputtering target made of Pb, Zr and Ti, and this sputtering target has the same composition as a target piezoelectric thin film device, or the same ratio of Zr and Ti, and contains an excessive amount of Pb of from 0 to 0.4 mol.

With this arrangement, at the same time that the piezoelectric thin film is formed, the predetermined crystal orientation is obtained, and excellent piezoelectric characteristics are exhibited.

Fourth Embodiment

According to a fourth embodiment of the present invention, the piezoelectric thin film device explained in the first embodiment is further improved.

As already explained, generally, a piezoelectric thin film device that includes an electromechanical conversion function has a lamination structure wherein a piezoelectric thin film is sandwiched between electrodes in the direction of its thickness. To simplify the explanation, the direction of thickness of the piezoelectric thin film device is regarded as the vertical direction, and an electrode provided below is called the lower electrode, while an electrode provided above is called the upper electrode.

The crystal structure of the piezoelectric thin film includes a plurality of crystal grains, the main portion, and of grain boundaries that encircle the crystal grains. And when the piezoelectric thin film is formed, upward, from the lower electrode side, it grows as a result of not a little affect attributable to the lower electrode, which serves as an underlayer. Generally, at this time, the crystal grains that make up the main portion of the piezoelectric thin film grow column-like, while the grain boundaries for the columnar crystals are likewise formed from the lower electrode of the piezoelectric thin film to the upper electrode, i.e., continuously, in the direction of thickness of the piezoelectric thin film. This trend is especially remarkable when the piezoelectric thin film is continuously formed using a physical vapor phase growth method (PVD), such as sputtering or the chemical vapor phase growth method (CVD).

For the piezoelectric thin film device, various proposals have been advanced according to which the piezoelectric characteristics are improved by providing an improved process for forming a plurality of crystal grains, the main portion of the thin film device, and grain boundaries that encircle the crystal grains. However, in addition to a need for the improvement in the piezoelectric characteristics, another important problem is the provision of a countermeasure for the deterioration of the voltage resistance characteristic due to a reduction in the thickness of the piezoelectric thin film.

The affects produced by defects in the crystal grains, such as a lack of oxygen, and the affects attributable to the sizes of the crystal grains or the state of the grain boundaries, are regarded as factors for determining the superiority or inferiority of the withstand voltage characteristic of the piezoelectric thin film, and several views and improvement proposals have been offered for affects attributable to the sizes of the crystal grains or the state of the grain boundaries.

Specifically, according to JP-A-2000-307163, JP-A-2001-237468 and JP-A-10-217458, for example, since the grain boundaries of columnar crystals that are continuously formed, in the direction of thickness of the piezoelectric thin film, might become current leakage passages (leakage paths) between the upper electrode and the lower electrode, structures for reducing currents that follow these potential leakage paths, or structures for reducing currents that may flow along the crystal boundary are proposed. Further, according to JAE-HYUN JOO, YOU-JIN LEE and SEUNG-KI JOO, Ferroelectrics, 1997, vol. 196, pp. 1-4, for example, the crystal grain sizes may be increased until as large as possible to reduce the grain boundary density of the piezoelectric thin film, or to form a piezoelectric thin film of a single crystal.

The technique for measuring the piezoelectric constant of the piezoelectric thin film that is obtained is disclosed in JP-A-2002-225285. Furthermore, disclosed in JP-A-2001-332041 is a piezoelectric thin film actuator, which is employed in a mechanism that supports a head used for recording and reproducing information relative to a disk, loaded into a disk drive, that serves as a storage device for a computer.

However, when the above described crystal structure is employed to improve the withstand voltage characteristics of the piezoelectric thin film, deterioration of the piezoelectric characteristics may occur, or when the piezoelectric thin film device is driven, a destructive defect, such as a crack or a split, may occur.

The correlation between the piezoelectric and the withstand voltage characteristics is not yet clear; generally, however, it is more preferable, for the piezoelectric characteristic, that the columnar crystals continuously grow along the same crystal axes. Furthermore, the sizes of the crystal grains usually are increased as the formation temperature is raised; however, during formation at a high temperature using a material, such as PZT, that contains Pb, a shortage of Pb occurs, and the piezoelectric characteristic is greatly deteriorated.

In addition, when there are many portions wherein crystal growth is discontinuous in the direction of thickness, or there are film portions wherein adhesiveness is weak, these portions can cause cracks in consonance with mechanical vibrations that are generated when the piezoelectric thin film device is driven. Accordingly, a destructive phenomenon, such as the splitting or rupturing of the piezoelectric thin film, occurs. Ideally, to prevent these problems, a single crystal should be employed for a piezoelectric thin film; however, because of limitations imposed by substrates, this is actually very difficult.

On the other hand, the withstand voltage characteristics might be degraded also during the process for forming the piezoelectric thin film. That is, in a case wherein a substance other than an element that serves as a piezoelectric member, has entered during the formation of the piezoelectric thin film, there occurs a specific area to which an electric field is applied at a higher intensity than that applied to an area having a predetermined thickness. Therefore, this specific area becomes a bottleneck and the withstand voltage characteristics are deteriorated.

Specifically, an area for which the thickness is smaller than that predetermined is formed when a foreign substance, such as a conductive material, enters, or when an upper electrode is formed after a foreign substance once entered is removed. Therefore, destructive damage occurs easily when a voltage is applied.

During the piezoelectric thin film formation, the effectiveness of a procedure for preventing the entry of a foreign substance only by managing the manufacturing process is limited, because it is difficult to uniformly deposit a film across the entire area of the lower electrode (in a case wherein the piezoelectric thin film is deposited on the lower electrode, the designated deposition area is the upper surface of the lower electrode; here, that is, the deposition area means the areal range within which the piezoelectric thin film is to be deposited), and all in all, the acquisition of a low withstand voltage area can not be avoided. For a piezoelectric thin film device, the thickness and the voltage to be applied are designed by considering the withstand voltage characteristics of a piezoelectric thin film, and when a low withstand voltage area, as described above, is present, the reliability is remarkably reduced. Therefore, a countermeasure for removing a low withstand voltage area is also required for the piezoelectric thin film forming process.

As will be described in detail, the fourth embodiment will be provided while taking these problems into account, and the objective of this embodiment is to provide a highly efficient and reliable piezoelectric thin film device for which the piezoelectric and the withstand voltage characteristics are superior.

Further, the fourth embodiment provides a method for manufacturing a piezoelectric thin film device that includes a piezoelectric thin film having a crystal structure that does not cause deterioration of the piezoelectric characteristics and that has superior withstand voltage characteristics.

In order to achieve the objectives, a piezoelectric thin film according to the fourth embodiment is formed of columnar crystal grains that are aligned in a direction leading from one electrode (e.g., a lower electrode) to the other electrode (e.g., an upper electrode), and these columnar crystal grains are composed of crystal grains that have been continuously grown from one electrode (e.g., the lower electrode) to the other electrode (e.g., the upper electrode) and crystal grains that have discontinuously been grown from one electrode to another.

More specifically, a piezoelectric thin film according to the fourth embodiment includes an area having a predetermined film thickness and an area (within an areal range described above) that is thinner than the predetermined thickness, and the area having the predetermined thickness is formed of columnar crystal grains that have been continuously grown from one electrode to the other, while the area having a thickness smaller than that predetermined is formed of columnar crystal grains grown from one electrode to the other, but that include a discontinuous portion (a portion wherein the columnar crystal grains are discontinuous in the direction of the growth of the grains).

Most of the areal range of the piezoelectric thin film that serves as a piezoelectric thin film device has a predetermined thickness, but part of the film is thinner than the predetermined thickness. The area having the predetermined thickness is formed of columnar crystal whose crystal grains have been continuously grown from one end to the other end in the direction of the film thickness. While on the other hand, in the area that is thinner than the predetermined thickness, crystal grains have not been continuously grown from one end to the other end in the direction of thickness, and a portion wherein the crystal growth is discontinuous is present.

In addition, as will be described later, the area that is thinner than the predetermined thickness is locally present within the areal range in which the piezoelectric thin film device is formed.

Therefore, in most of the area having a predetermined thickness, superior piezoelectric characteristics are obtained. While in the area that is thinner than the predetermined area, since the discontinuous portion is present in among the columnar crystal grains, a leakage path is interrupted, and the withstand voltage characteristics are improved. The area that is thinner than the predetermined thickness is a portion in which, when a drive voltage is applied, the effective electric field is high and a dielectric breakdown tends to occur. However, since the withstand voltage characteristics almost equal those in the area that has the predetermined thickness, the entire piezoelectric thin film device acquires superior piezoelectric and withstand voltage characteristics.

For the piezoelectric thin film of the fourth embodiment as well as that explained in the first embodiment, it is preferable that crystal boundaries be formed between the crystal grains, and that the same crystal orientation be established for the crystal boundaries and for the crystal grains. It is also preferable that the crystal boundaries formed between the crystal grains of the piezoelectric thin film at least contain the composite elements of the crystal grains, and a composition ratio be employed that provides piezoelectric characteristics.

When the structure of the fourth embodiment is employed for the piezoelectric thin film device explained in the first embodiment, the reliability of the piezoelectric thin film device can be considerably increased. That is, since a piezoelectric thin film having a crystal structure is employed for which the piezoelectric function and the withstand voltage characteristic are superior, a reliable and highly efficient piezoelectric thin film device can be obtained.

The fourth embodiment of the present invention will now be described in detail while referring to the drawings.

Figure 18:
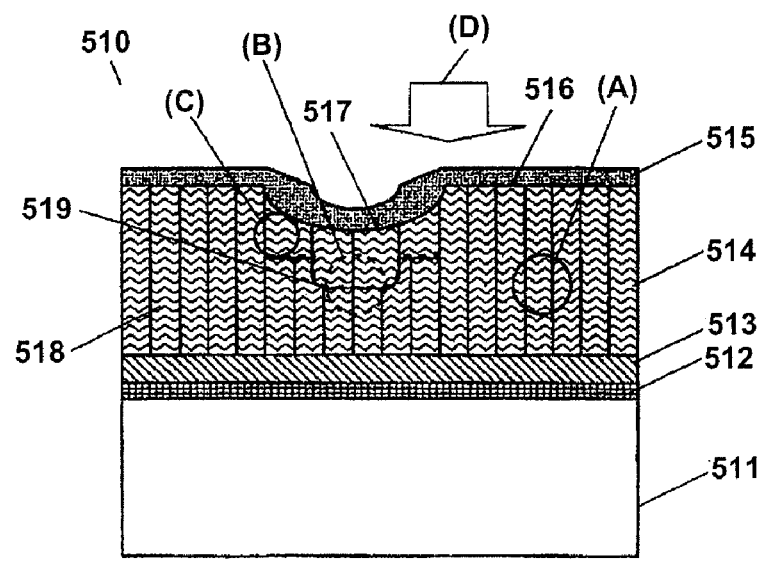
FIG. 18 is a cross sectional view of the structure of a piezoelectric thin film device according to a fourth embodiment of the present invention.

FIG. 18 is a cross sectional view of the structure of a piezoelectric thin film device 510 according to the fourth embodiment of the invention.

The piezoelectric thin film device 510 in FIG. 18 has a laminated structure wherein an adhesive layer 512, a lower electrode 513, a piezoelectric thin film 514 and an upper electrode 515 are deposited in the named order on the upper face of a substrate 511.

The substrate 511, for example, is formed as a disk having a thickness of 0.3 mm and a diameter of 4 inches. As the substrate 511, a silicon substrate, a glass substrate, a metal substrate or a ceramic substrate can be arbitrarily employed.

The adhesive layer 512 can be formed of titanium, tantalum, iron, cobalt, nickel or chromium, or a compound of them. The film thickness is from 0.005 μm to 1 μm, and in the fourth embodiment, a titanium layer 0.02 μm thick is employed. It should be noted that the adhesive layer 512 is formed in order to increase the adhesiveness between the substrate 511 and the lower electrode 513, and is not always required.

The lower electrode 513 is formed, at the least, of either a precious metal selected from among platinum (Pt), iridium, palladium and ruthenium, or a compound of them. The film thickness is 0.05 μm to 2 μm. In the fourth embodiment, however, a Pt layer 0.22 μm thick is employed.

The piezoelectric layer 514 is composed of a piezoelectric material containing PZT, as its primary element, that has a perovskite crystal structure of a rhombohedral system or of a tetragonal system. That is, the material used for the piezoelectric thin film 514 also includes PMN or PZN, which is obtained by adding a dopant, such as La, Sr, Nb or Al, to PZT. The thickness of the piezoelectric thin film 514 is from 0.5 μm to 10 μm, but in this embodiment, for example, is 3.5 μm.

The piezoelectric thin film 514 is preferentially oriented relative to a (111) plane or a (001) plane. As for the composition of PZT, near the boundary (morphotropic phase boundary) between the tetragonal system and the rhombohedral system, the ratio of Zr/Ti ranges from 30/70 to 70/30. In the fourth embodiment, Zr/Ti=53/47.

A conductive material is employed for the upper electrode 515, the thickness of which is from 0.1 μm to 0.5 μm. In the fourth embodiment, a 0.2 μm thick Pt layer is employed.

Before the upper electrode 515 is laminated on the piezoelectric thin film layer 514, the film deposition step is divided into, for example, two film deposition steps, and a cleaning step for removing foreign substances that may have entered is performed between the two film deposition steps. Therefore, most of the piezoelectric thin film 514 falls within a designated area 516 having a predetermined thickness, while the thickness of the remainder of the piezoelectric thin film 514, within a designated area 517 (an area from which a foreign substance was removed), is smaller than that predetermined.

In order for the diagram in FIG. 18 to be more easily understood, the outer edge portion of the piezoelectric thin film layer 514 is the designated area 516, and has the predetermined thickness, and the inner portion is the designated area 517, exaggeratedly illustrated, and its thickness is smaller than that predetermined. However, according to the observation results obtained using an SEM, the area 517, for which the thickness is smaller than that predetermined, is locally formed within a very limited region, the location of which may differ, depending on how and when the foreign substance was mixed in during the first film formation process.

As sample 2, an explanation will be given for a piezoelectric thin film device manufacturing method whereby the cleaning step, for removing a foreign substance that has been mixed in, is inserted between the steps for depositing the piezoelectric thin film 514, and both film formation steps are performed.

Further, as comparison example 1, an explanation will be given for the processing by which the piezoelectric thin film 514 is deposited using a single film formation step (a cleaning step is not performed during the formation step).

Comparison of sample 2 with comparison example 1 is performed in order to represent the characteristic superiority of the piezoelectric thin film device for the fourth embodiment, explained while referring to FIG. 18.

The view obtained based on the SEM observation results (FIGS. 19 to 24) will also be described for sample 2.

(Sample 2)

For the piezoelectric thin film device 510 shown in FIG. 18, an adhesive layer 512, a lower electrode 513, a piezoelectric thin film 514 and an upper electrode 515 were sequentially deposited on a substrate 511 using sputtering. Prior to deposition of the upper electrode 515, the piezoelectric thin film 514 was formed through two processes.

That is, in sample 2, the step of forming the piezoelectric thin film 514 includes the following steps.

(I) A film having a predetermined thickness is deposited during the first film deposition step.

(II) Thereafter, the substrate on which the film has been deposited is extracted from a vacuum chamber, and the cleaning step for removing foreign substances is performed.

(III) Then, at the second film formation step, film formation is performed until the final predetermined thickness is reached.

While the individual steps will be described later, the film formation process in sample 2 is divided to provide two steps. When 3 μm, for example, is the final predetermined thickness of the piezoelectric thin film 514, this thickness is divided in two, and a 1.5 μm thick film is formed during the first and the second steps. However, the thickness of the film need not be the same for the first and second steps.

The method for manufacturing the piezoelectric thin film device 510 will now be described in detail.

First, in argon gas at 1 Pa degree of vacuum, the substrate 511 was heated to 400° C. using a titanium (Ti) target, and 100 W high-frequency AC power was applied for one minute. In this manner, the 0.02 μm adhesive layer 512 was formed.

Following this, in argon gas at 1 Pa degree of vacuum, the substrate 511 was heated to 400° C. using a platinum (Pt)

target, and 200 W high-frequency AC power was applied for twelve minutes. As a result, the lower electrode 513 of 0.22 μm was formed.

A sputtering device was then employed to form the piezoelectric thin film 514. A PZT (Zr/Ti=53/47, and Pb, in an amount augmented by a 20 mol % excess) sintered target, whose Pb content was greater than the stoichiometric composition, was employed.

At the first film formation step, in an atmosphere (gas volume ratio of $Ar:O_2=18:2$) consisting of argon gas mixed with oxygen at 0.3 Pa degree of vacuum, the substrate 511 was heated to 580° C., and 250 W high-frequency AC power was applied for 90 minutes. As a result, a film having a thickness of 1.5 μm was deposited. The thus obtained piezoelectric thin film 514 is called a piezoelectric thin film 514a (not shown).

Thereafter, the substrate 511 was extracted from the vacuum chamber, and the piezoelectric thin film 514a was rinsed (cleaning step).

First, the substrate 511 for which the film deposition had been performed was immersed in a cleaning chamber wherein an alkaline cleaner was retained, and was then placed in a shower cleaning device, where the surface of the substrate 511 was washed with pure water to remove attached substances. Sequentially, thereafter, the substrate 511 was rubbed, using a rotary brush, with running pure water to remove any foreign substance that might have entered during the first film formation step. Following this, the substrate 511 was rinsed with running pure water, and was dried in a spin dryer. When the cleaning process is physically performed in this manner, a foreign substance that may cause deterioration of the withstand voltage characteristics can more thoroughly be removed.

After the cleaning step had been performed, the substrate 511 on which the piezoelectric thin film 514a was formed was again set in the sputtering device, and the second film was overlaid on the piezoelectric thin film 514a (second film formation step).

At the second film formation step, in an atmosphere (gas volume ratio of $Ar:O_2=15:5$) of argon gas mixed with oxygen at 0.3 Pa degree of vacuum, the substrate 511 on which the piezoelectric thin film 514a had been formed was heated to 620° C., using the same target as was employed for forming the piezoelectric thin film 514a, and 200 W high-frequency AC power was applied for 95 minutes. In this manner, lamination of a 1.5 μm film was accomplished, and finally, the 3 μm thick piezoelectric thin film 514 was obtained. When the film formation conditions at the second step differ from those at the first step, the crystallinity and the film quality of the piezoelectric thin film can be controlled within a wider range.

Following this, when, in argon gas at 1 Pa degree of vacuum, 200 W high-frequency AC power was applied, using a Pt target, at room temperature for ten minutes, the 0.2 μm thick upper electrode 515 was formed on the upper face of the piezoelectric thin film 514.

Prior to forming the upper electrode 515, the piezoelectric thin film 514 was observed using the SEM, and the crystal structure and the crystal orientation of the piezoelectric thin film 514 were examined using X-ray diffraction and the $\sin^2 \theta$ method. As a result, the piezoelectric thin film 514 was found to include a perovskite crystal structure of a rhombohedral system, and to have the (111) orientation. Furthermore, based on the SEM observation results (FIGS. 19 to 24), the following was found.

Figure 19:
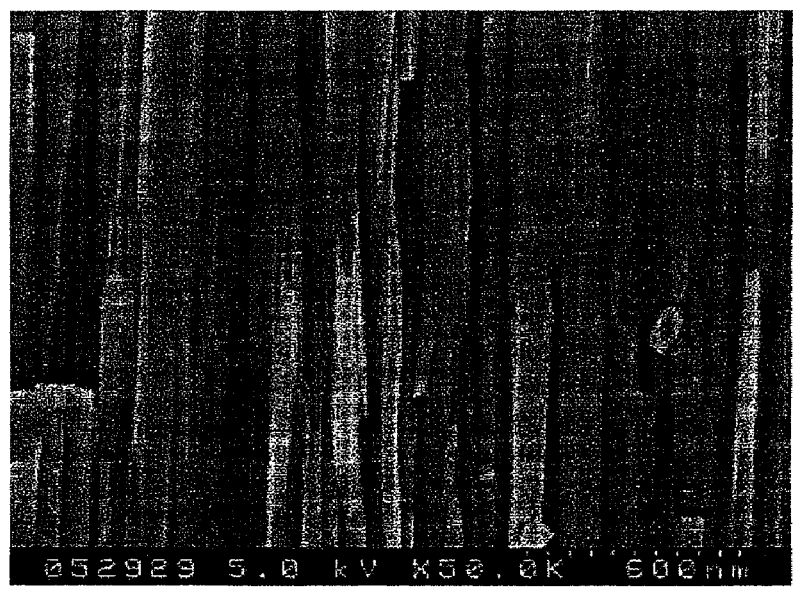
FIG. 19 is a diagram showing an SEM photograph showing an SEM observed image obtained by observing a cross sectional portion (A) shown in FIG. 18.

FIG. 19 is an SEM photograph showing the SEM observed image of a cross sectional portion (A) in FIG. 18.

When the cross sectional portion (A) of the piezoelectric thin film 514 was scanned, it was observed that, as shown in FIG. 19A, nearly the entire film had a predetermined thickness (e.g., 3.0 μm) (the area 516). Crystal grains in this area 516 have grown, column-like, and this crystal growth has formed, in the direction of thickness, a columnar structure that rises substantially perpendicularly from the lower electrode 513 to the upper electrode 515. This indicates that the area 516 possesses superior piezoelectric characteristics. Moreover, referring to FIGS. 19 to 24, it is evident that most of the crystal grains in the area 516 range in size from 0.02 μm to 0.3 μm.

An area 517, for which the thickness is smaller than that predetermined, when observed as part of the final upper surface, corresponds to a location from which a foreign substance, which entered during the first film formation process, was removed at a succeeding cleaning step, and over which film was thereafter laminated during the second film formation process. This area 517 was formed in a very limited region, the location of which may differ, depending on how and when the foreign substance was mixed in during the first film formation process.

Figure 20:
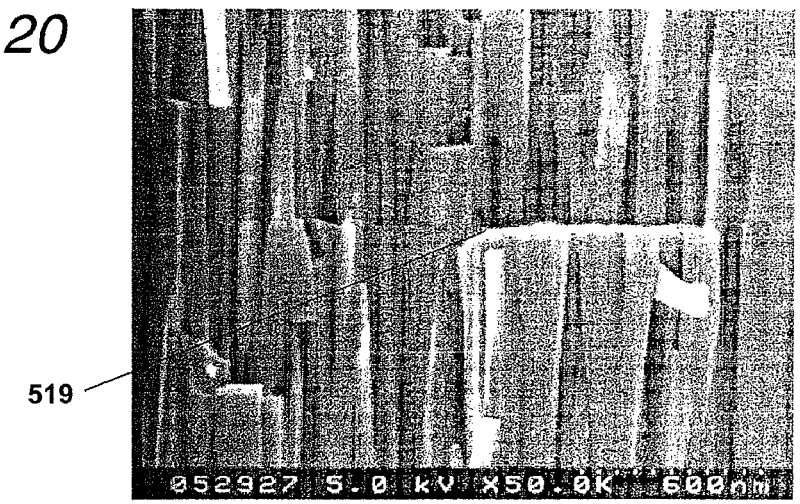
FIG. 20 is a diagram showing an SEM photograph showing an SEM observed image obtained by observing a cross sectional portion (B) shown in FIG. 18.

FIG. 20 is an SEM photograph showing an SEM observed image of a cross sectional portion (B) in FIG. 18.

As shown in FIG. 20, an area 517, for which the thickness is smaller than that predetermined, a discontinuous portion 519 is present in the columnar crystal grown in the direction of thickness, and the grain boundaries grow differently on both sides of the discontinuous portion 519. Although the view of the columnar crystal is exaggerated in the photograph of FIG. 18, it is evident that the grains in the columnar crystal grown from the lower electrode 513 to the discontinued portion 519 differ in size from the grains in the columnar crystal grown from the discontinued portion 519 to the upper electrode 515, i.e., the grains in the latter columnar crystal portion are larger.

Figure 22:
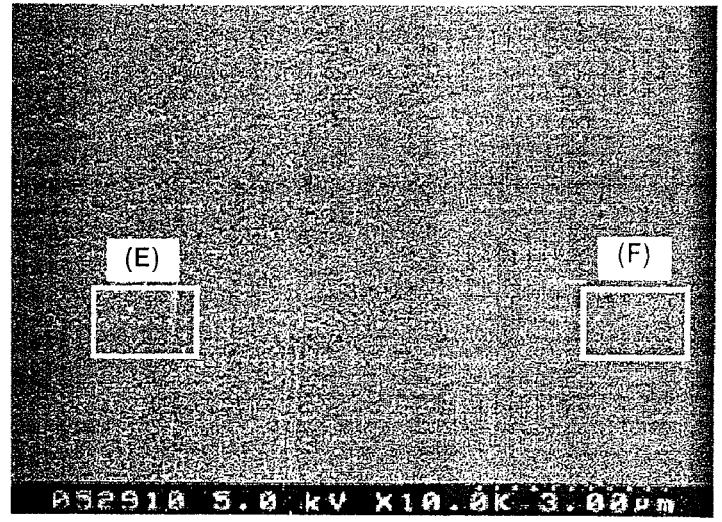
FIG. 22 is a diagram showing an SEM photograph showing an SEM observed image of the surface observed along the grain boundary that was viewed from a portion (D) in FIG. 18, while a portion (E) is located near an area having a thickness smaller than a predetermined film thickness, and a portion (F) is located near an area having the predetermined thickness.

FIG. 22 is a diagram showing the SEM photograph of a portion (D) in FIG. 18.

The portion (D) represents the surface of the boundary between the area 516, which has the predetermined thickness, and the area 517, for which the thickness is smaller than that predetermined.

In FIG. 22, a portion (E) is located alongside the area 517, for which the thickness is smaller than that predetermined, and a portion (F) is located alongside the area 516, which has the predetermined thickness.

Figure 23:
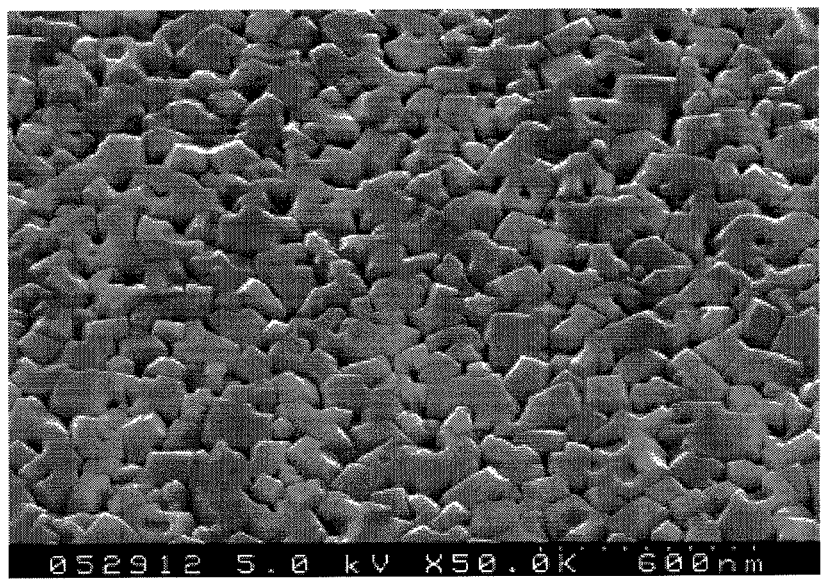
FIG. 23 is a diagram showing an enlarged SEM photograph showing an SEM observed image obtained by observing the surface of the portion (E) shown in FIG. 22.

FIG. 23 is an enlarged SEM photograph showing an SEM observed image obtained by observing the surface of portion (E) in FIG. 22.

Figure 24:
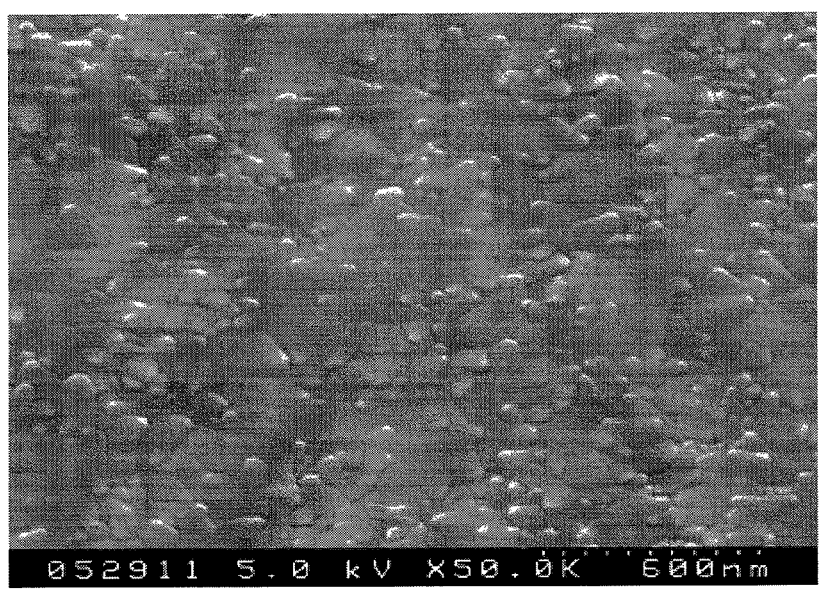
FIG. 24 is a diagram showing an enlarged SEM photograph showing an SEM observed image obtained by observing the surface of the portion (F) shown in FIG. 22.

FIG. 24 is an enlarged SEM photograph showing an SEM observed image obtained by observing the surface of portion (F) in FIG. 22.

It should be noted, however, that the photographs in FIGS. 22 to 24 show the state before the upper electrode 515 is formed on the upper face of the piezoelectric thin film 514.

According to these photographs, it is evident that the grains in the area 517, for which the thickness is smaller than that predetermined (FIG. 23), are obviously larger than those in the area 516, which has the predetermined thickness (FIG. 24).

Specifically, through observation from the side of the upper electrode 515 formed on the area 517, for which the thickness is smaller than that predetermined, it is found, as shown in FIG. 23, that most of the grains range in size from 0.06 μm to 0.8 μm, and thus are larger than those (as previously described, 0.02 μm to 0.3 μm) in the area 516, which has the predetermined thickness. Further, in the area 517, for which the thickness is smaller than that predetermined, the portion above the discontinuous portion 519, i.e., toward the upper electrode 515, consists of columnar crystal grains having larger sizes.

As described above, the temperature (a substrate temperature) for the second film formation process is set to 620° C., which is higher than the 580° C. temperature (also a substrate temperature) set for the first film formation process. Furthermore, the surface of the portion, or portions, from which a foreign substance was removed at the cleaning step is rougher than the surface of the other portion, and has an uneven shape.

Although not yet explicated, it is our considered opinion that when a higher temperature is set for a second film formation process and the surface states of the crystals differ, for an area wherein no foreign substance was originally present (an area that serves, finally, as an "area 516, which has the predetermined thickness"), columnar crystal grains having almost the same sizes are formed during both the first and the second film formation processes, and for an area from which a foreign substance was removed (an area that serves, finally, as the "area 517, for which the thickness is smaller than that predetermined"), the sizes of the columnar crystal grains formed during the second film formation process are larger than those formed during the first film formation process.

Therefore, in the area 517 that has a thickness smaller than that predetermined, since the grain boundary density is reduced above the discontinuous portion 519, a grain boundary that is to be continuously formed in the direction of thickness and is to be used as a leakage path is cut off (discontinued) at the discontinuous portion 519. That is, the occurrence of a current leakage can be halted in the area 517, for which the thickness is smaller than that predetermined, and the withstand voltage characteristics can be improved.

In this case, the columnar crystal grains obtained during the first film formation process may be preferentially oriented on the (111) plane or the (101) plane, for example, and the columnar crystal grains obtained during the second film formation process may be preferentially oriented on the (001) plane. That is, the preferential orientation plane may be changed between the columnar crystal grains obtained during the first process and the columnar crystal grains obtained during the second process, and a different crystal orientation state may be obtained (i.e., for the area 517, which has a thickness smaller than that predetermined, the discontinuous portion 519 is employed to discontinue the crystal orientation). The crystal orientation can be simply changed, for example, by adjusting the film formation temperature.

When the piezoelectric characteristics are important, the preferential orientation on the (001) plane is preferable. However, in this case, the adhesiveness relative to the lower electrode 513 (see FIG. 18) might be insufficient, and the reliability of the piezoelectric thin film device might be deteriorated. However, when the crystal orientation differs between the first and the second film formation processes, the adhesiveness relative to the lower electrode 513 can be increased, and a piezoelectric thin film device can be obtained that has, as a whole, superior piezoelectric characteristics.

In addition, in this case, it is preferable that the period required for the second film formation process be longer than the period for the first film formation process, and that larger columnar crystal grains be formed during the second film formation process. This is so because, as described above, the piezoelectric thin film having the (001) face dominantly affects the piezoelectric characteristic. Further, the entire film formation process can be divided into three or more steps in order to obtain the withstand voltage characteristics.

Figure 21:
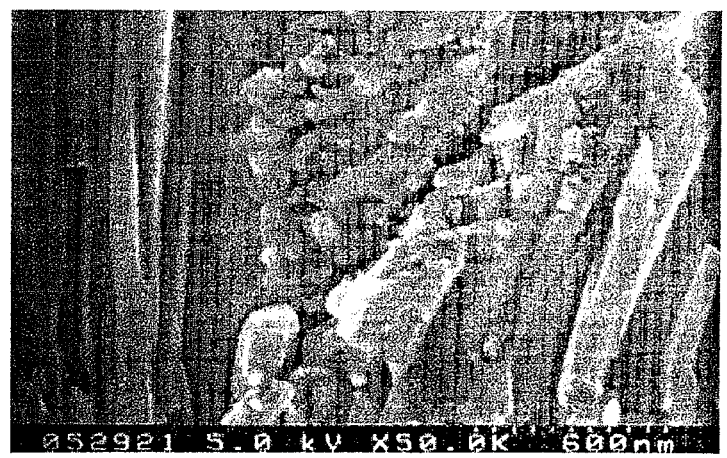
FIG. 21 is a diagram showing an SEM photograph showing an SEM observed image obtained by observing a cross sectional portion (C) shown in FIG. 18.

FIG. 21 is an SEM photograph showing an SEM observed image obtained by observing a cross sectional portion (C) in FIG. 18.

As shown in FIG. 21, near the boundary between the area 516, which has the predetermined thickness, and the area 517, which has a thickness smaller than that predetermined, columnar crystal on the side of the area 516, which has the predetermined thickness, has grown continuously in the direction of thickness, while columnar crystal on the side of the area 517, which has a thickness smaller than that predetermined, has grown obliquely, relative to the direction of thickness, and at random. Furthermore, in the area 517, which has a thickness smaller than that predetermined, the direction of crystal grain growth near the boundary is oblique, relative to the direction of thickness, but assumes a more parallel direction as the distance from the grains to the boundary is increased.

This indicates that since the coupling strength for crystal grains is increased at the boundary at which the film thickness differs, and since neither cracks nor splits occur due to mechanical vibrations generated while being driven, a superior driving reliability has been obtained.

Throughout this explanation, the sputtering method has been employed to form the piezoelectric thin film 514. However, another vacuum evaporation method or a vapor phase growth method, such as laser ablation, ion plating, MBE, MOCVD or plasma CVD, may also be employed to form: a piezoelectric thin film having superior piezoelectric and withstand voltage characteristics. Furthermore, a sol-gel method or a hydrothermal crystal growth method, such as has currently drawn attention, may also be employed.

Next, in order to evaluate the withstand voltage characteristics of a piezoelectric thin film device wherein an upper electrode 515 is laminated on a piezoelectric thin film 514 formed in the above described manner, a photoresist was applied to the upper electrode 515 using a spin coater, and a predetermined pattern was formed by exposing and developing the photoresist. Thereafter, the upper electrode 515 was patterned, using a dry etching device, to obtain 400 piezoelectric thin film devices.

For all 400 piezoelectric thin film devices, each of which was provided by a 1.5 mm×0.2 mm pattern, a DC voltage of 40 V was continuously applied to the upper and lower electrodes for 200 hours, and the withstand voltage characteristics were evaluated. As a result, a current leakage total for the 400 piezoelectric thin film devices was equal to or lower than $5 \times 10^{-7}$ (A), which was the same as a value obtained prior to performing the measurement.

Furthermore, after the upper electrode 515 patterns were driven, their external appearances were individually observed, in detail, and no abnormalities, such as dielectric breakdowns or cracks, were found; the external appearances were apparently unchanged, compared with those obtained before the devices were driven.

This indicates that dielectric breakdowns or cracks will not occur in a piezoelectric thin film device such as was prepared in sample 2, because no defects were found in the area 516, which has the predetermined thickness, and the original withstand voltage characteristics were maintained. Further, in the area 517, which has a thickness smaller than that predetermined, the withstand voltage characteristics were improved, while the piezoelectric characteristics were lower than those in the area 516. Therefore, when the same voltage is applied as is in the area 516, i.e., when the effective electric field is increased, dielectric breakdowns or cracks do not occur because there is little mechanical displacement difference relative to the area 516, which has the predetermined thickness. As described above, it can be understood that superior withstand voltage characteristics and excellent driving reliability can be obtained for the entire driving portion of the piezoelectric thin film 514.

Sequentially, by dicing, the piezoelectric thin film 514 on which the upper electrode 515 was not yet laminated was cut into 100 15 mm×2 mm cantilevers, and then, the 0.2 μm thick upper electrode 515 was formed on the individual cantilevers using sputtering, and the piezoelectric constant d31 was measured. As a result, the average piezoelectric constant d31 for the cantilevers was found to be 152 pC/N, and the variance was σ=3.4%. It should be noted that the method disclosed, for example, in JP-A-2002-225285 was employed for the measurement of the piezoelectric constant d31.

As one of the features of the present invention, the film formation process, as described above, is divided into two steps, and included between them is a cleaning step. In JP-A-2006-217188, a piezoelectric thin film device manufacturing method is disclosed that comprises steps of: forming a first electrode layer on a substrate; forming a first piezoelectric layer on the first electrode layer; patterning the first piezoelectric layer to form a first piezoelectric member, and patterning the first piezoelectric member to form a first electrode; cleaning the surface of the first piezoelectric member; forming a second piezoelectric member on the cleaned surface of the first piezoelectric member and forming, thereby, a piezoelectric member wherein the second piezoelectric member is laminated on the first piezoelectric member; and forming a second electrode on the piezoelectric member.

According to JP-A-2006-217188, ion sputtering is employed, specifically at a cleaning step between the formation of a first piezoelectric layer and the formation of a second piezoelectric layer, and two objectives of its use are the following:

(i) the removal of an oxidized film and an organically contaminated film; and (ii) the maintenance of orientation continuity (to ensure the first and second layers have the same orientation).

However, when low energy ion sputtering is employed, the intent of objective (i) will be insufficiently satisfied, and when high energy ion sputtering is employed, the intent of objective (ii) will be difficult to satisfy because the surface of the piezoelectric member, which is an underlayer, becomes rough.

As described above, objectives (i) and (ii) initially include technical contradictions, i.e., when low energy ion sputtering is employed to satisfy the intent of objective (ii), too little energy is available to adequately remove foreign substances that enter during formation of the first piezoelectric layer. And on the other hand, when ion sputtering is performed with sufficient energy available to ensure the removal of foreign substances, tiny unevenness are formed in the piezoelectric member surface, and the maintenance of crystal grain orientation continuity is difficult.

Since the present invention employs the above described cleaning step to remove foreign substances from film deposited at the first formation step, and to maintain the surface condition of piezoelectric thin film in areas in which no foreign substances are present, a more superior piezoelectric thin film device can be provided.

COMPARISON EXAMPLE 1

According to comparison example 1, as well as sample 2, to obtain a piezoelectric thin film device, sputtering was used to sequentially deposit, on a substrate 511, an adhesive layer 512, a lower electrode 513, a piezoelectric thin film 514 and an upper electrode 515. In comparison example 1, only one film formation process was used to form piezoelectric thin film 514 having a predetermined thickness; and a cleaning step was not performed.

The processing prior to the formation of the piezoelectric thin film 514 was performed in the same manner as for sample 2, and for forming the piezoelectric thin film 514, the conditions for the first film formation process in sample 2 were employed and maintained for 180 minutes. The piezoelectric thin film 514 was 3.0 μm thick and had a perovskite crystal structure of a rhombohedral system, and was preferentially oriented with the (111) plane.

As a result of an SEM observation, the entire area of the piezoelectric thin film 514 was determined to have a columnar structure, which had grown continuously in the direction of thickness. Further, as in sample 2, an area was present that had a thickness smaller than that predetermined; unlike in sample 2, however, the growth of columnar crystal in this area was continuous, and the crystal grain growth was the same as that in an area having the predetermined thickness. In addition, some areas had greater thicknesses than that predetermined because foreign substances had entered during film formation and had become embedded.

Next, as well as in sample 2, the upper electrode 515 was formed, and then 400 1.5 mm×0.2 mm piezoelectric thin film devices having individual patterns were fabricated. For all of these 400 piezoelectric thin film devices, a DC 40 V voltage was continuously applied to the upper and lower electrodes for 200 hours, to evaluate the withstand voltage characteristics.

In comparison example 1, immediately after a voltage was applied to the piezoelectric thin film devices, a leak current occurred, and after 200 hours had elapsed, $1\times10^{-5}$ (A) or more leak current was observed in 26 piezoelectric thin film devices. As a result, the leak current increased, when compared with results obtained before the measurement was begun.

In addition, the external appearances of the individual patterns of the upper electrode 515 were closely observed. In the piezoelectric thin film devices in which leak current were increased, abnormalities, such as graphitized dielectric breakdown portions or cracks, were observed in the external appearance, and failures occurred. As a trend, many dielectric breakdowns were observed in the piezoelectric thin film devices where leak currents had initially occurred, and when the driving period was extended, most of the failures noted were crack or split occurrences.

This indicates that, relative to the piezoelectric thin film device in comparison example 1, as well as in sample 2, defect do not occur in areas having a predetermined thickness, and that abnormalities, such as dielectric breakdowns or cracks, are not found because original withstand voltage characteristics are maintained. However, unlike in sample 2, areas having thicknesses smaller than that predetermined, as well as areas having the predetermined thickness, are formed of columnar crystal that has grown continuously. Thus, the withstand voltage characteristics are deteriorated as a result of increases in field intensities upon the application of like voltages, and this causes the dielectric breakdowns. This reactive mode occurs frequently, especially during initial driving periods.

That is, when the piezoelectric thin film device in comparison example 1 is driven continuously, in an area having a thickness smaller than that predetermined and having the same the crystal structure in the direction of thickness, the effective field is increased while the piezoelectric characteristics of the film are unchanged. Therefore, a difference in mechanical displacement appears, relative to an area having the predetermined thickness, and at the boundary between the areas, a crack or cracks occur due to stress. Thus, it is hypothesized that when a driving period is continued, most of the period is occupied by this reactive mode.

Furthermore, according to the piezoelectric thin film device in comparison example 1, in an area whose thickness is greater than that predetermined, because a foreign substance is embedded, a gap is formed in the direction of thickness due to the presence of the foreign substance. Therefore, it is hypothesized that when the foreign substance is conductive, the effective film thickness will be small, and that cracks or dielectric breakdowns will occur as in an area having a thickness smaller than that predetermined.

The piezoelectric thin film 514 on which the upper electrode 515 was laminated was cut by dicing it into 100 15 mm×2 mm cantilevers. Then, sputtering was used to form the 0.2 µm thick upper electrode 515 on the individual cantilevers, and the piezoelectric constant d31 was measured. As a result, the average piezoelectric constant d31 of the cantilevers was determined to be 156 pC/N, and the variance, to be σ=3.6%.

As described above, according to a comparison of the piezoelectric thin film with the comparison example 1, the orientation is the same and the piezoelectric characteristics are almost the same. However, since the entry of foreign substances that deteriorate the withstand voltage characteristics can not be prevented, areas in which the withstand voltage characteristics have been deteriorated are present, and thus, when a piezoelectric thin film is driven, satisfactory withstand voltage characteristics can not be obtained for the entire piezoelectric thin film. Further, since cracks or splits occur during a long driving period, reliability during driving is not ensured.

On the other hand, according to the piezoelectric thin film device manufacturing method explained in sample 2, i.e., the manufacturing method in the fourth embodiment, a piezoelectric thin film having a predetermined thickness is obtained by performing at least two film formation steps and a foreign substance removal step in between. As a result, the entry of foreign substances that deteriorate the withstand voltage characteristics can be prevented.

Further, for such a piezoelectric thin film, in addition to the main area having a predetermined thickness, an area having a thickness smaller than that predetermined is locally formed in a portion from which a foreign substance has been removed. This area having the smaller thickness, has a discontinuous structure, wherein crystal boundaries are discontinued, with the discontinuous portion in between, and the boundary density is reduced in a large grain size area. That is, in the area having the smaller thickness, the withstand voltage characteristic is improved because a leakage path is discontinued by the discontinuous boundary structure. And in the main area having the predetermined thickness, appropriate withstand voltage characteristics are maintained.

That is, according to the piezoelectric thin film device 510 of the fourth embodiment, the area 517, which has a smaller thickness than that predetermined, is a portion where, when a drive voltage is applied, the effective field is high and a dielectric breakdown tends to occur. However, since generation of a leakage path, for a current that flows through the grain boundary upon application of a voltage, can be prevented by the discontinuous boundary structure, the withstand voltage characteristics can be improved.

As described above, an area having a thickness smaller than that predetermined has the same withstand voltage characteristic as has an area having the predetermined thickness, and a piezoelectric thin film device can be provided wherein superior withstand voltage and piezoelectric characteristics can be obtained from the entire area.

The piezoelectric thin film device 510 explained in the fourth embodiment, as well as the one in the first embodiment, can be employed as an actuator for an inkjet head, and an inkjet recording apparatus can be constituted by using this ink jet head. Since this configuration is the same as explained in detail for the second and third embodiments, no further explanation will be given.

As described above, the piezoelectric thin film device of the present invention is an optimal component for an inkjet head and for an inkjet recording apparatus.

The piezoelectric thin film device of this invention can also be applied, for example, for thin film capacitors, charge-storage capacitors for nonvolatile memory devices, various actuators, infrared sensors, ultrasonic sensors, pressure sensors, angular velocity sensors, acceleration sensors, flow sensors, shock sensors, piezoelectric transducers, piezo spark ignition devices, piezoelectric loudspeakers, piezoelectric microphones, piezoelectric filters, piezoelectric pickups, fork oscillators and delay lines.

The piezoelectric thin film device of this invention is especially appropriate as a piezoelectric thin film actuator (see, for example, JP-A-2001-332041) that is employed in a disk support mechanism wherein a head is mounted on a substrate in order to either record or reproduce information on disks that are rotated by a disk drive (used as a computer storage device), and wherein a piezoelectric thin film device also mounted on the substrate deforms the substrate to displace the head.

This application is based upon and claims the benefit of priority of Japanese Patent Application No 2007-020854 filed on Jan. 31, 2007 and Japanese Patent Application No 2007-052483 filed on Mar. 2, 2007, the contents of which is incorporated herein by references in its entirety.

What is claimed is:

1. A piezoelectric thin film device comprising a piezoelectric thin film provided between electrodes,
   wherein the piezoelectric thin film includes crystal grains and grain boundaries that are provided between the crystal grains; and
   wherein a same crystal orientation is established for the grain boundaries and the crystal grains,
   wherein a ratio of a crystal orientation peak intensity for the piezoelectric thin film is equal to or greater than 0.15, relative to a crystal orientation peak intensity for a single crystal thin film, which has the same thickness as the piezoelectric thin film and for which a (001) single orientation is established.

2. The piezoelectric thin film device according to claim 1, wherein the piezoelectric thin film comprises polycrystal, for which a (001) single orientation of crystal grains is obtained.

3. The piezoelectric thin film device according to claim 1, wherein a columnar crystal is employed, so that crystal grains grow, beginning with one end attached to an electrode, substantially in a perpendicular direction.

4. The piezoelectric thin film device according to claim 1, wherein sizes of the crystal grains are set as 0.02 to 0.5 µm, and widths of the grain boundaries are set as 1 to 5 nm.

5. The piezoelectric thin film device according to claim 1, wherein the piezoelectric thin film is formed by a vapor phase growth method, including sputtering, vacuum evaporation, laser ablation, ion plating, MBE, MOCVD or plasma CVD.

6. An inkjet head, comprising:
   a piezoelectric thin film device according to claim 1;

a vibration plate film, which is deposited on an electrode-side face of the piezoelectric thin film device; and a pressure chamber member, which is bonded to a face of the vibration plate film opposite the piezoelectric thin film device and which has pressure chambers for storing ink, wherein, through piezoelectric effects of the piezoelectric thin film device, the vibration plate film is displaced in the direction of the thickness to eject ink from the pressure chambers.

7. An inkjet recording apparatus comprising:

an inkjet head according to claim 6; and a mover that moves the inkjet head relative to a recording medium, wherein when the inkjet head is being moved relative to the recording medium by the mover, the inkjet head performs recording by ejecting ink, which is stored in the pressure chambers, onto the recording medium through nozzles that communicate with the pressure chambers.

8. A piezoelectric thin film device comprising a piezoelectric thin film provided between electrodes, wherein the piezoelectric thin film includes crystal grains and grain boundaries that are provided between the crystal grains; and wherein a same crystal orientation is established for the grain boundaries and the crystal grains, wherein a piezoelectric constant d31 for the piezoelectric thin film is set so as to change, relative to the hysteresis of an applied voltage, within a range of $0 \leq 100 \times \{(d31 \text{ (maximum value)} - d31 \text{ (minimum value)})/(d31 \text{ (maximum value)} + d31 \text{ (minimum value)})\} < 10$.

9. A piezoelectric thin film device comprising a piezoelectric thin film provided between electrodes, wherein the piezoelectric thin film includes crystal grains and grain boundaries that are provided between the crystal grains; and wherein a same crystal orientation is established for the grain boundaries and the crystal grains, wherein the piezoelectric thin film includes columnar crystal grains that are aligned in a direction leading from one electrode to the other electrode; and wherein the columnar crystal grains include columnar crystal grains that have been continuously grown from one electrode to the other electrode and columnar crystal grains that have discontinuously been grown from one electrode to the other electrode.

10. A piezoelectric thin film device comprising a piezoelectric thin film provided between electrodes, wherein the piezoelectric thin film includes crystal grains and grain boundaries that are provided between the crystal grains; and wherein a same crystal orientation is established for the grain boundaries and the crystal grains, wherein the piezoelectric thin film includes columnar crystal grains that are aligned in a direction leading from one electrode to the other electrode;

wherein the columnar crystal grains include columnar crystal grains that have been continuously grown from one electrode to the other electrode and columnar crystal grains that include a discontinuous portion that has discontinuously been grown from one electrode to the other electrode; and wherein the orientation of the crystal grains on opposite sides of the is different than each other.

11. A piezoelectric thin film device comprising a piezoelectric thin film provided between electrodes, wherein the piezoelectric thin film includes crystal grains and grain boundaries that are provided between the crystal grains; and wherein a same crystal orientation is established for the grain boundaries and the crystal grains, wherein the piezoelectric thin film includes columnar crystal grains that are aligned in a direction leading from one electrode to the other electrode;

wherein the columnar crystal grains include columnar crystal grains that have been continuously grown from one electrode to the other electrode and columnar crystal grains that include a discontinuous portion that has discontinuously been grown from one electrode to the other electrode; and wherein sizes for the crystal grains on opposite sides of the discontinuous portion are different from each other.

12. The piezoelectric thin film device according to claim 11, wherein, with the discontinuous portion in between, sizes of columnar crystal grains formed later are larger than those of columnar crystal grains formed earlier.

13. A piezoelectric thin film device comprising a piezoelectric thin film provided between electrodes, wherein the piezoelectric thin film includes crystal grains and grain boundaries that are provided between the crystal grains; and wherein a same crystal orientation is established for the grain boundaries and the crystal grains, wherein the piezoelectric thin film includes an area having a predetermined film thickness and an area that is thinner than the predetermined film thickness; and wherein the area having the predetermined film thickness includes columnar crystal grains that have been continuously grown from one of the electrodes to the other electrode, and the area that is thinner than the predetermined film thickness includes columnar crystal grains that have been grown from one of the electrodes to the other electrode and that include a discontinuous portion.

* * * * *

UNITED STATES PATENT AND TRADEMARK OFFICE
CERTIFICATE OF CORRECTION

| | | |
|---|---|---|
| PATENT NO. | : 8,020,974 B2 | Page 1 of 1 |
| APPLICATION NO. | : 12/022219 | |
| DATED | : September 20, 2011 | |
| INVENTOR(S) | : S. Hara et al. | |

It is certified that error appears in the above-identified patent and that said Letters Patent is hereby corrected as shown below:

On Cover page 2 (56) References Cited, Foreign Patent Documents, please add reference "JP 2004-104066 4/2004".

Signed and Sealed this
Third Day of January, 2012

David J. Kappos
*Director of the United States Patent and Trademark Office*